United States Patent
Kuwabara et al.

(10) Patent No.: US 11,145,597 B2
(45) Date of Patent: Oct. 12, 2021

(54) SEMICONDUCTOR DEVICE AND METHOD OF MANUFACTURING THE SAME

(71) Applicant: RENESAS ELECTRONICS CORPORATION, Tokyo (JP)

(72) Inventors: Shinichi Kuwabara, Ibaraki (JP); Yasutaka Nakashiba, Ibaraki (JP); Teruhiro Kuwajima, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/505,228

(22) Filed: Jul. 8, 2019

(65) Prior Publication Data
US 2020/0043847 A1  Feb. 6, 2020

(30) Foreign Application Priority Data
Aug. 1, 2018  (JP) .............................. JP2018-144797

(51) Int. Cl.
| | | |
|---|---|---|
| H01L 23/522 | (2006.01) | |
| H01L 23/495 | (2006.01) | |
| H01L 23/00 | (2006.01) | |
| H01L 21/762 | (2006.01) | |
| H01L 21/8238 | (2006.01) | |
| H01L 23/528 | (2006.01) | |
| H01L 21/768 | (2006.01) | |
| H01L 27/092 | (2006.01) | |
| H01L 27/06 | (2006.01) | |

(52) U.S. Cl.
CPC .... *H01L 23/5227* (2013.01); *H01L 21/76224* (2013.01); *H01L 21/76802* (2013.01); *H01L 21/823871* (2013.01); *H01L 21/823878* (2013.01); *H01L 23/49575* (2013.01); *H01L 23/528* (2013.01); *H01L 24/48* (2013.01); *H01L 24/49* (2013.01); H01L 27/0688 (2013.01); H01L 27/0928 (2013.01); H01L 2224/48137 (2013.01); H01L 2224/49176 (2013.01)

(58) Field of Classification Search
CPC ... H01L 23/5227; H01L 28/10; H01L 23/645; H01L 21/76224; H01L 21/823481; H01L 21/823878; H01L 21/76229; H01L 2924/19042; H01F 2017/0086
See application file for complete search history.

(56) References Cited

U.S. PATENT DOCUMENTS

| | | | |
|---|---|---|---|
| 8,410,493 B2 | 4/2013 | Nakashiba | |
| 2012/0062040 A1* | 3/2012 | Kaeriyama | ......... H01L 23/5227 307/104 |

FOREIGN PATENT DOCUMENTS

JP    2010-219122 A    9/2010

\* cited by examiner

*Primary Examiner* — John A Bodnar
(74) *Attorney, Agent, or Firm* — McDermott Will & Emery LLP

(57) ABSTRACT

A semiconductor device includes a first semiconductor chip on which a first circuit is formed and a second semiconductor chip on which two circuits are formed. In the first semiconductor chip, a first inductor on the transmitting side electrically connected with the first circuit and a second inductor on the receiving side electrically connected with the second circuit via the bonding wire are formed. In plan view, the first inductor and the second inductor are disposed so as not to overlap each other, and are arranged along each other.

10 Claims, 55 Drawing Sheets

SEMICONDUCTOR DEVICE AND METHOD OF MANUFACTURING THE SAME

CROSS-REFERENCE TO RELATED APPLICATIONS

The disclosure of Japanese Patent Application No. 2018-144797 filed on Aug. 1, 2018 including the specification, drawings and abstract is incorporated herein by reference in its entirety.

BACKGROUND

Disclosed embodiments relate to a semiconductor device and a manufacturing method thereof, and the disclosed embodiments can be suitably used, for example, in a semiconductor device including isolators.

For environmental protection, for example, in the automobile field, a shift from a gasoline engine to a motor has been attempted as a power source. The rotational speed of the motor is controlled by a power semiconductor device on which power semiconductors for electric power are mounted. The power semiconductor device is controlled by a semiconductor device including a microcomputer.

In the semiconductor device in which the power semiconductor for electric power are mounted, voltages of about several hundred volts are treated. On the other hand, the semiconductor device including the microcomputer is driven by voltages of about several volts. In order to control the semiconductor device on which a power semiconductor element for electric power is mounted by a microcomputer, signals need to be transmitted and received between a circuit including the power semiconductor element and a circuit including the microcomputer.

A semiconductor device called an isolator is used as a semiconductor device for mediating the transmission and reception of semiconductor device signals whose reference voltages differ from each other. In the isolator, an electric signal is transmitted between an inductor connected to the circuit including the power semiconductor element and the inductor connected to the circuit including the microcomputer. The one inductor and the other inductor are disposed with an insulating film interposed between the one inductor and the other inductor. Japanese Unexamined Patent Application Publication No. 2010-219122 discloses an example of such the isolator.

SUMMARY

When the voltage difference between the voltage difference treated in the semiconductor device on which the power semiconductor element for electric power is mounted and the voltage difference between the voltage difference treated in the semiconductor device including the microcomputer increases, the distance between one inductor and the other inductor needs to be increased in order to secure the withstand voltage. Therefore, it is necessary to increase the thickness of an insulating film (interlayer insulating film) interposed between one inductor and the other inductor.

However, when the thickness of the insulating film is increased, it is assumed that the semiconductor substrate warps due to a film stresses of the insulating film. If the semiconductor substrate warps, in the semiconductor manufacturing apparatus, for example, the conveyance of the semiconductor substrate is hindered, and semiconductor substrate satisfactory treatment is hindered.

Other objects and novel features will become apparent from the description of this specification and the accompanying drawings.

The semiconductor device according to embodiments includes a first circuit, a second circuit, a first inductor, and a second inductor. The first circuit is driven by a first voltage. The second circuit is driven at a second voltage higher than the first voltage. The first inductor is electrically connected to the first circuit. The second inductor is electrically connected to the second circuit. In plan view, the first inductor and the second inductor are arranged such that the first inductor and the second inductor do not disposed each other and are arranged along each other.

The manufacturing method of the semiconductor device according to another embodiment comprises the following steps. Semiconductor substrate is prepared. The first element area and the second element area are respectively defined on a main surface of the semiconductor substrate. A first circuit driven by a first voltage is formed in the first element region, and a second circuit driven by a second voltage higher than the first voltage is formed in the second element region. A first semiconductor chip including the first circuit and a second semiconductor chip including the second circuit are formed by sequentially forming a plurality of interlayer insulating films that electrically insulate each of the plurality of wiring and the plurality of wiring on the semiconductor substrate so as to cover the first circuit and the second circuit to form a multilayered wiring structure. A step of forming the multi-layer wiring structure includes the following steps. A first inductor electrically connected to the first circuit is formed in a region to be a first semiconductor chip. A second inductor electrically connected to the second circuit is formed in a region to be a first semiconductor chip. In a step of forming the first inductor and a step of forming the second inductor, in plan view, the first inductor and the second inductor are disposed such that the first inductor and the second inductor do not overlap each other and are arranged along each other.

According to the semiconductor device of embodiments, the breakdown voltage between the first inductor and the second inductor can be ensured without thickening the insulating film.

According to the manufacturing method of the semiconductor device according to another embodiment, it is possible to manufacture a semiconductor device capable of securing a breakdown voltage between the first inductor and the second inductor without thickening the insulating film.

DETAILED DESCRIPTION

Figure 1:
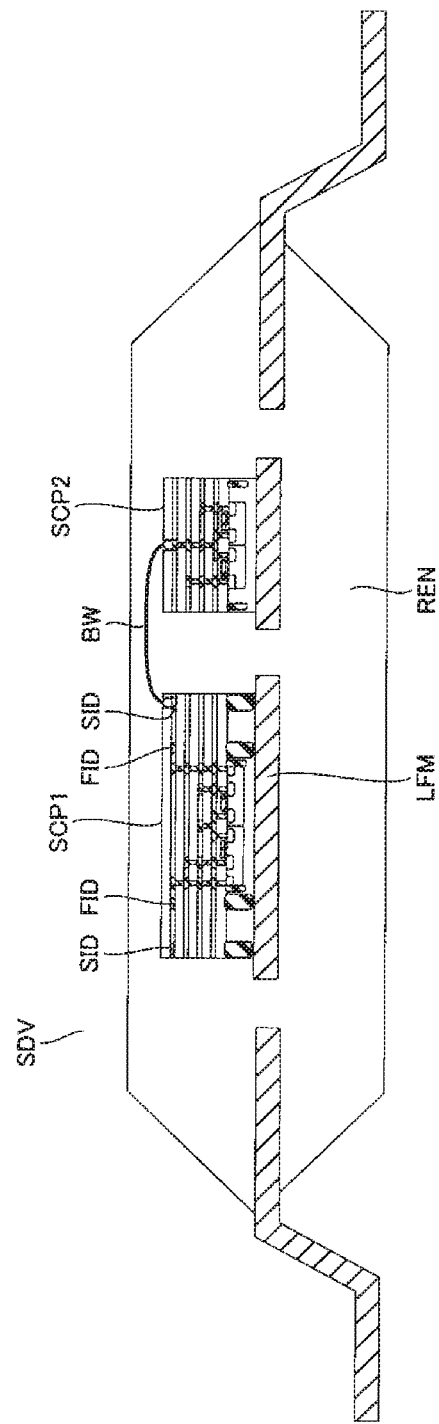
FIG. 1 is the cross-sectional view of a semiconductor device according to first embodiment.
Figure 2:
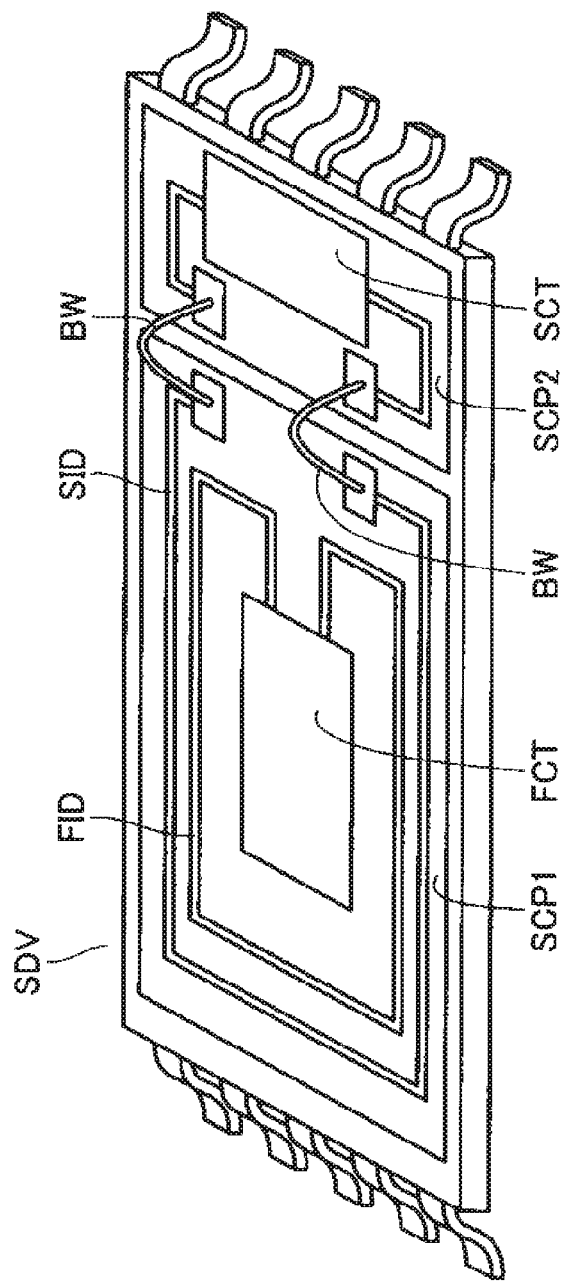
FIG. 2 is a perspective view illustrating a structure of a semiconductor device is illustrated in the embodiment.

A semiconductor device relating to first embodiment first embodiment will be explained. As shown in FIGS. 1 and 2, the semiconductor device SDVs include a first semiconductor chip SCP1 and a second semiconductor chip SCP2. Each of the first semiconductor chip SCP1 and the second semiconductor chip SCP2 is mounted on the lead frame LFM and sealed with the sealing resin REN.

In the first semiconductor chip SCP1, for example, a first circuit FCT including a modulating unit and a transmitting-side driver circuit is formed. In the first semiconductor chip SCP1, for example, a voltage of about several volts is treated. The second semiconductor chip SCP2 is formed with a second circuit SCT including, for example, a receiving circuit and a receiving-side driver circuit. In the second semiconductor chip SCP2, for example, a voltage of about several hundred volts is treated.

The first inductor FID on the transmitting side and the second inductor SID on the receiving side are formed on the first semiconductor chip SCP1. The first inductor FID is electrically connected with the first circuit FCT. The second inductor SID is electrically connected with the second circuit SCT via a bonding wire BW. The first inductor FID and the second inductor SID are inductively coupled with each other to transmit a signal.

The first inductor FID and the second inductor SID are disposed such that the first inductor FID and the second inductor SID do not overlap each other and are arranged along each other in plan view of the semiconductor device SDV (first semiconductor chip SCP1). The first inductor FID and the second inductor SID are annularly extended along the outer periphery of the first semiconductor chip SCP1. Here, the second inductor SID is disposed outside the first inductor FID. It should be noted that the "annular shape" means that the first inductor FID and the second inductor SID are formed along the outer peripheral part of the first semiconductor chip SCP1, and the first inductor FID and the second inductor SID do not need to be closed.

Figure 3:
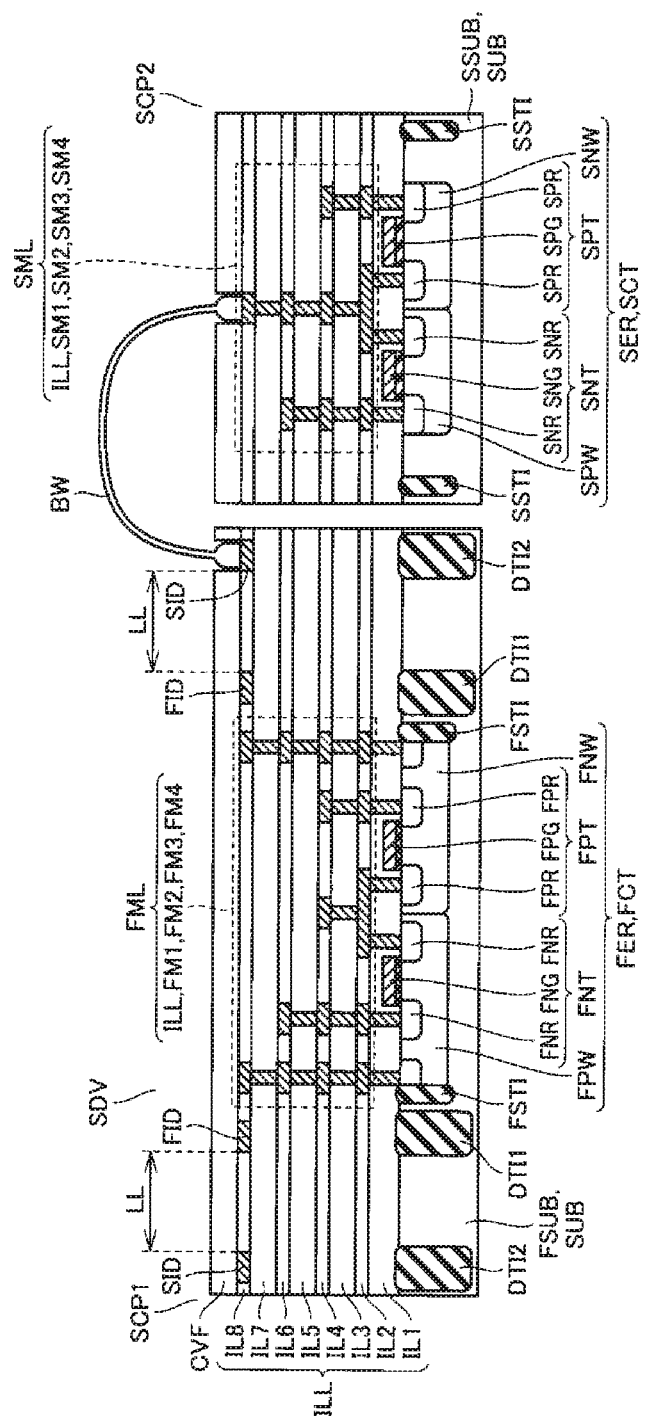
FIG. 3 is a cross-sectional view of the first semiconductor chip and the second semiconductor chip in the embodiment.

Next, the first semiconductor chip SCP1 and the second semiconductor chip SCP2 will be described in detail. As shown in FIG. 3, in the first semiconductor chip SCP1, the first element regions FER are defined by the first element isolation insulating film FSTI formed on the first semiconductor substrate FSUB (semiconductor substrate SUB). The first isolation insulating film FSTI is formed to a predetermined depth from the front surface of the first semiconductor substrate FSUB. In the first element region FER, for example, an n-channel type first transistor FNT and a p-channel type first transistor FPT, which constitute a part of the first circuit FCT, are formed.

The n-channel first transistor FNT is formed in the p-type first well FPW. In the p-type first well FPW, a pair of n-type first impurity regions FNR as a source and a drain are formed. Gate electrodes FNG are formed on surfaces of portions of the p-type first well FPW sandwiched by the pair of n-type first impurity regions FNR with gate dielectric film interposed therebetween.

The p-channel first transistor FPT is formed in the n-type first well FNW. In the n-type first well FNW, a pair of p-type first impurity regions FPR as a source and a drain are formed. Gate electrodes FPG are formed on the surfaces of the portions of the n-type first well FNW sandwiched by the pair of p-type first impurity regions FPR with gate dielectric film interposed therebetween.

An interlayer insulating film IL1 is formed on a first semiconductor substrate FSUB (semiconductor substrate SUB) so as to cover the first transistor FNT of the n-channel type and the first transistor FPT of the p-channel type. An interlayer insulating film IL2 is formed so as to cover the interlayer insulating film IL1, and a wiring FM1 is formed in the wiring trench of the interlayer insulating film IL2. An interlayer insulating film IL3 is formed on the interlayer insulating film IL2 so as to cover the wiring FM1.

An interlayer insulating film IL4 is formed so as to cover the interlayer insulating film IL3, and wiring FM2 is formed in the wiring trench of the interlayer insulating film IL4. An interlayer insulating film IL5 is formed on the interlayer insulating film IL4 so as to cover the wiring FM 2. An interlayer insulating film IL6 is formed so as to cover the interlayer insulating film IL5, and a wiring FM3 is formed in the wiring trench of the interlayer insulating film IL6. An interlayer insulating film IL7 is formed on the interlayer insulating film IL6 so as to cover the wiring FM3.

The wiring FM4, the first inductor FID, and the second inductor SID are formed so as to be in contact with surfaces of the interlayer insulating film IL7. In plan view, the first inductor FID and the second inductor SID are disposed so as to surround the first element region FER. An interlayer insulating film IL8 is formed so as to fill each side of the wiring FM4, the first inductor FID, and the second inductor SID.

A cover film CVF is formed on the interlayer insulating film IL8 so as to cover the first inductor FID, the second inductor SID, and the wiring FM4. Multi-layer wiring structures FML are formed by the wiring FM1 to FM4 and the interlayer insulating film ILL (IL1~IL8). The wiring FM1 to FM4 are electrically connected with each other by vias penetrating through the corresponding interlayer insulating films ILLs.

A first insulator DTI1 is formed in a part of the first semiconductor substrate FSUB located immediately below the first inductor FID. The first insulator DTI1 is formed from the surface of the first semiconductor substrate FSUB to a position deeper than the bottom of the first isolation insulating film FSTI1. When the first semiconductor substrate FSUB and the first inductor FID have the same potential, the first insulator DTI1 may not be formed. A second insulator DTI2 is formed in a part of the first semiconductor substrate FSUB located directly below the second inductor SID. The second insulator DTI2 is formed from the surface of the first semiconductor substrate FSUB to a position deeper than the bottom of the first isolation insulating film FSTI1.

In the second semiconductor chip SCP2, the second element regions SER are defined by the second element isolation insulating film SSTI formed on the second semiconductor substrate SSUB (semiconductor substrate SUB). The second isolation insulating film SSTI is formed to a predetermined depth from a surface of the second semiconductor substrate SSUB. In the second element region SER, for example, an n-channel type second transistor SNT and a p-channel type second transistor SPT, which constitute a part of the second circuit, are formed.

The n-channel second transistor SNT is formed in the p-type second well SPW. In the p-type second well SPW, a pair of n-type second impurity regions SNR as a source and a drain are formed. Gate electrodes SNG are formed on surfaces of portions of the p-type second well SPW sandwiched between the pair of n-type second impurity regions SNR with gate dielectric film interposed therebetween.

The p-channel second transistor SPT is formed in the n-type second well SNW. In the n-type second well SNW, a pair of p-type second impurity regions SPR as a source and a drain are formed. Gate electrodes SPG are formed on surfaces of portions of the n-type second well SNW sandwiched between the pair of p-type second impurity regions SPR with gate dielectric film interposed therebetween.

An interlayer insulating film IL1 is formed on a second semiconductor substrate SUB (semiconductor substrate SUB) so as to cover the second transistor SNT of the n-channel type and the second transistor SPT of the p-channel type. An interlayer insulating film IL2 is formed so as to cover the interlayer insulating film IL1, and a wiring SM1 is formed in the wiring trench of the interlayer insulating film IL2. An interlayer insulating film IL3 is formed on the interlayer insulating film IL2 so as to cover the wiring SM1. An interlayer insulating film IL4 is formed so as to cover the interlayer insulating film IL3, and wiring SM2 is formed in the wiring trench of the interlayer insulating film IL4.

An interlayer insulating film IL5 is formed so as to cover the wiring SM2. An interlayer insulating film IL6 is formed so as to cover the interlayer insulating film IL5, and wiring SM3 is formed in the wiring trench of the interlayer insulating film IL6. An interlayer insulating film IL7 is formed so as to cover the wiring SM3. The wiring SM4 is formed so as to be in contact with the interlayer insulating film IL7. An interlayer insulating film IL8 is formed so as to fill the sides of the wiring SM4.

A cover film CVF is formed on the interlayer insulating film IL8 so as to cover the wiring SM4. Multi-layer wiring structures SML are formed by the wiring SM1 to SM4 and the interlayer insulating film ILL (IL1~IL8). The wiring SM4 and the second inductor SID are electrically connected with each other by a bonding wire BW. The wiring SM1 to SM4 are electrically connected with each other by vias passing through the corresponding interlayer insulating films ILLs. The first semiconductor chip SCP1 and the second semiconductor chip SCP2 are configured as described above.

In the semiconductor device SDVs described above, the first inductor FID electrically connected with the first circuit FCT and the second inductor SID electrically connected with the second circuit are inductively coupled with each other, whereby signals are transmitted between the first semiconductor chip SCP1 and the second semiconductor chip SCP2, which are treated by voltages differing from each other.

Next, an example of the manufacturing method of the semiconductor device SDV described above will be described. Here, since the manufacturing process of the first semiconductor chip SCP1 and the manufacturing process of the second semiconductor chip SCP2 share many manufacturing step, they will be described in parallel for convenience of explanation.

Figure 4:
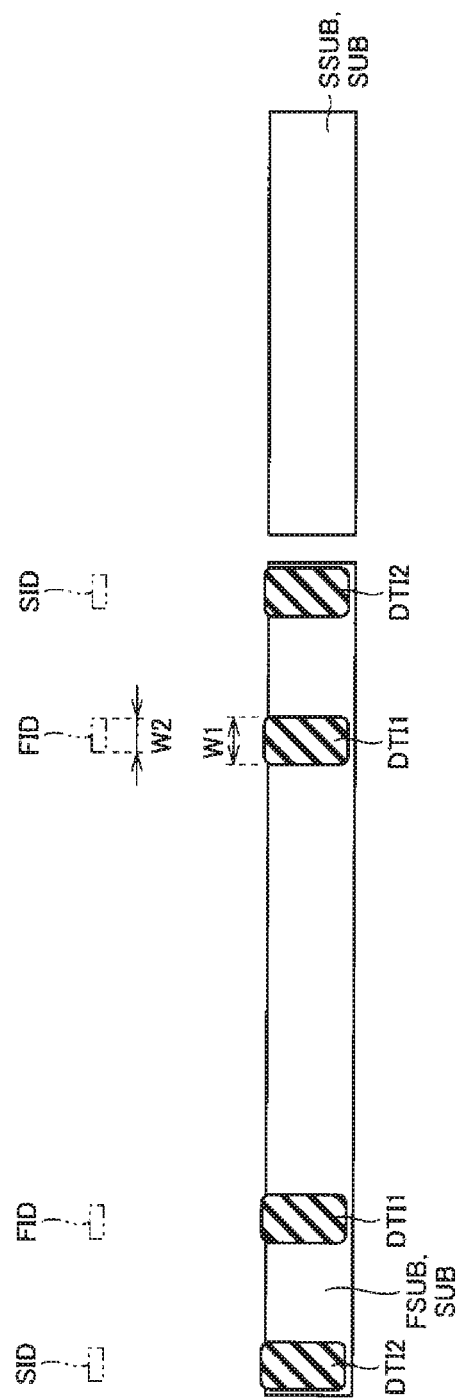
FIG. 4 is a cross-sectional view illustrating one step of the manufacturing method of semiconductor device in the embodiment.

As shown in FIG. 4, first, a first insulator DTI1 is formed by forming a relatively deep trench in a portion of a first semiconductor substrate FSUB (semiconductor substrate SUB) located immediately below the first inductor FID, and filling the trench with an insulating film. The second insulator DTI2 is formed by forming a relatively deep trench in a first semiconductor substrate FSUB (semiconductor substrate SUB) that is located directly below the second inductor SID and filling the trench with an insulating film. The first insulator DTI1 and the second insulator DTI2 are formed simultaneously.

The width W1 of each of the first insulator DTI1 and the second insulator DTI2 is set wider than the width W2 of each of the first inductor FID and the second inductor SID. In addition, the first insulator DTI1 and the second insulator DTI2 are formed from the surfaces of the semiconductor substrate SUB to a position deeper than the bottom of the first element isolation insulating film FSTI and the second element isolation insulating film SSTI, which will be described later, as shown in FIG. 5.

Figure 5:
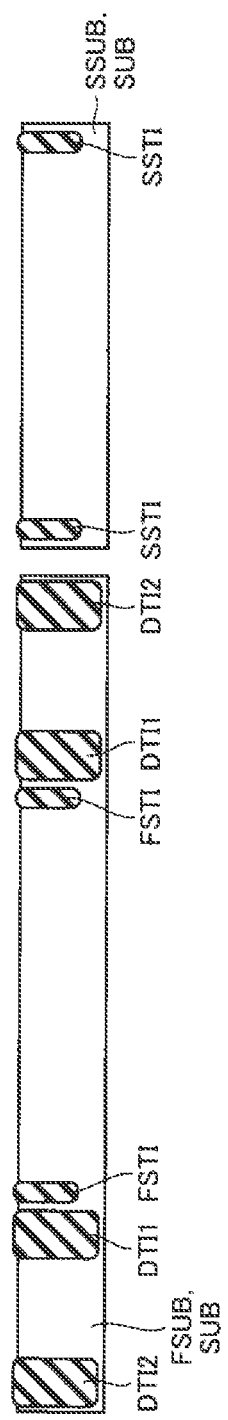
FIG. 5 is a cross-sectional view illustrating a step performed after the step shown in FIG. 4 in the embodiment.

Next, as shown in FIG. 5, a first isolation insulating film FSTI is formed by forming a relatively shallow trench in a first semiconductor substrate FSUB (the semiconductor substrate SUB) and filling the trench with an insulating film. A second isolation insulating film SSTI is formed by forming a relatively shallow trench in a second semiconductor substrate SUB (the semiconductor substrate SUB) and filling the trench with an insulating film. The first element region FER are defined by the first element isolation insulating film FSTI, as shown in FIG. 3. The second element region SER are defined by the second element isolation insulating films SSTI, as shown in FIG. 3.

Figure 6:
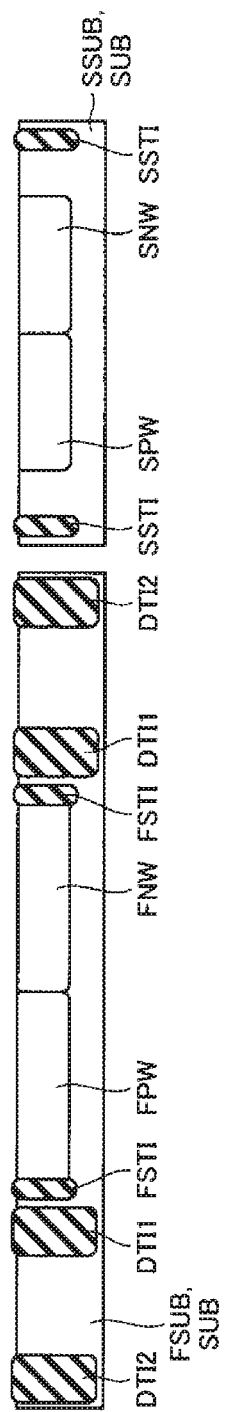
FIG. 6 is a cross-sectional view illustrating a step performed after the step shown in FIG. 5 in the embodiment.

Next, a predetermined photolithography process and an impurity implantation process of a predetermined conductivity type are performed, respectively. As a result, as shown in FIG. 6, a p-type first well FPW and an n-type first well FNW are formed in the first element region FER. In the second element region SER, a p-type second well SPW and an n-type second well SNW are formed, respectively.

Figure 7:
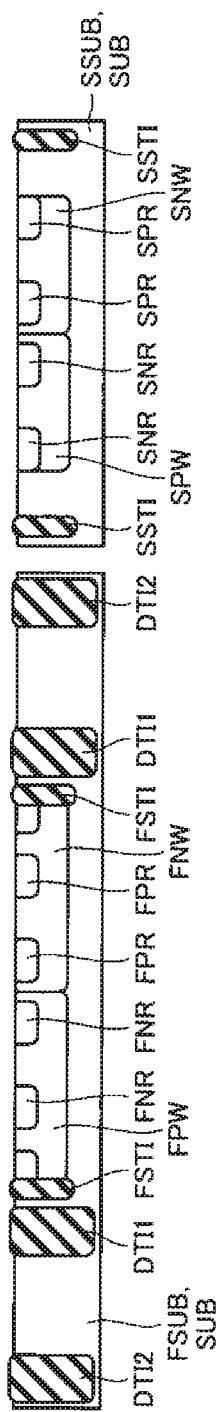
FIG. 7 is a cross-sectional view illustrating a step performed after the step shown in FIG. 6 in the embodiment.

Next, a predetermined photolithography process and an impurity implantation process of a predetermined conductivity type are performed, respectively. As a result, as shown in FIG. 7, an n-type first impurity region FNR and a p-type first impurity region FPR are formed in the first element region FER.

In the second element region SER, an n-type second impurity region SNR and a p-type second impurity region SPR are formed, respectively.

Figure 8:
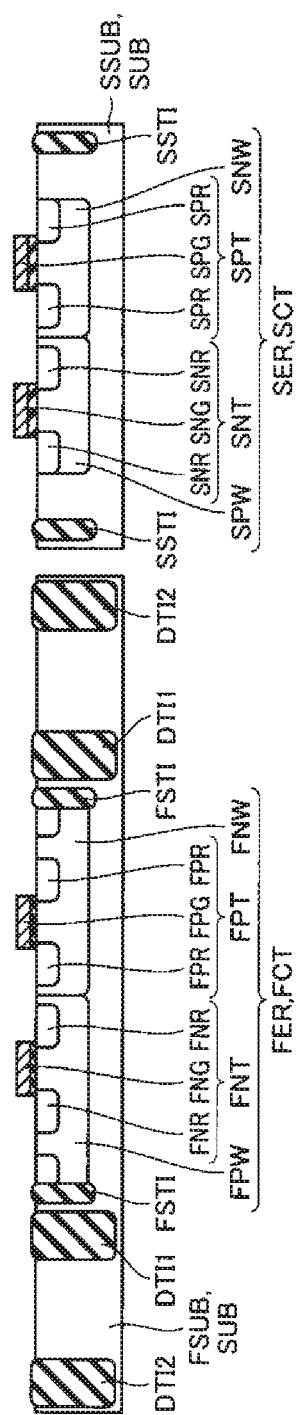
FIG. 8 is a cross-sectional view illustrating a step performed after the step shown in FIG. 7 in the embodiment.

Next, a silicon oxide film (not shown) is formed by a thermal oxidation method. A polysilicon film, for example, is formed to cover the silicon oxide film. Next, a predetermined photolithography process and a predetermined etching process are performed. As a result, as shown in FIG. 8, in the first device area FER, gate electrode FNG is formed on the surfaces of the p-type first wells FPW with gate dielectric film interposed therebetween. Gate electrode FPG is formed on a surface of the n-type first well FNR with gate dielectric film interposed therebetween. In the second device region SER, gate electrode SNG is formed on the surface of the p-type second well SPW with gate dielectric film interposed between the gate electrode SNG and the gate electrode SNG. The gate electrode SPG is formed on the surface of the n-type second well SNW with the gate dielectric film interposed between the gate electrode SPG and the gate electrode SPG.

Figure 9:
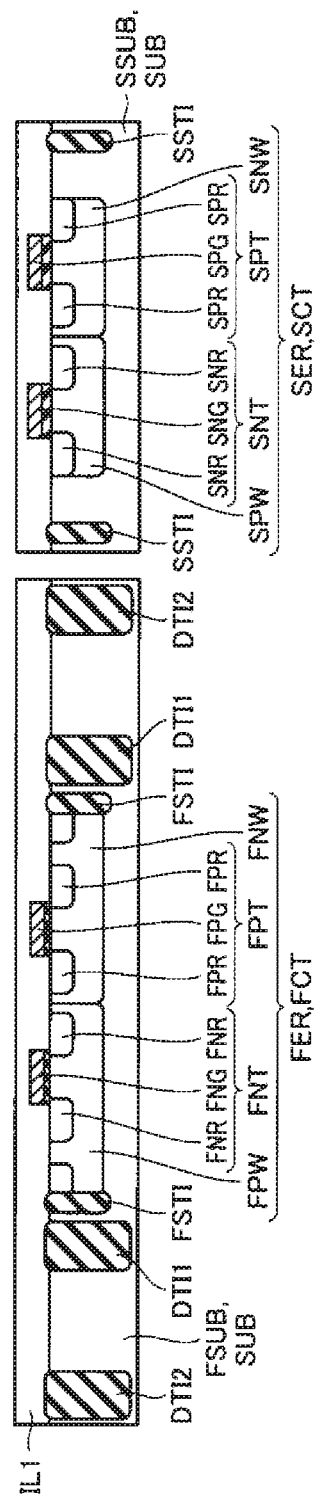
FIG. 9 is a cross-sectional view illustrating a step performed after the step shown in FIG. 8 in the embodiment.
Figure 10:
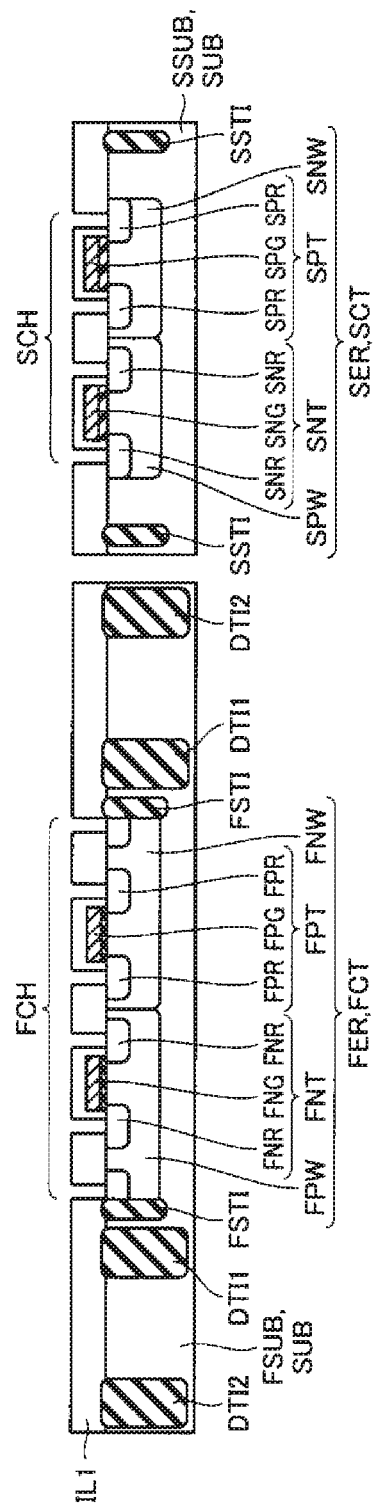
FIG. 10 is a cross-sectional view illustrating a step performed after the step shown in FIG. 9 in the embodiment.

Next, as shown in FIG. 9, an interlayer insulating film IL1 is formed by, for example, a Chemical Vapor Deposition (CVD) method so as to cover the gate electrodes FNG and FPG. An interlayer insulating film IL1 is formed so as to cover the gate electrodes SNG and SPG. Next, predetermined photolithography treatment and etching treatment are performed. As a result, as shown in FIG. 10, a contact hole FCH is formed in the first element region FER. In the second element region SER, a contact hole SCH is formed.

Figure 11:
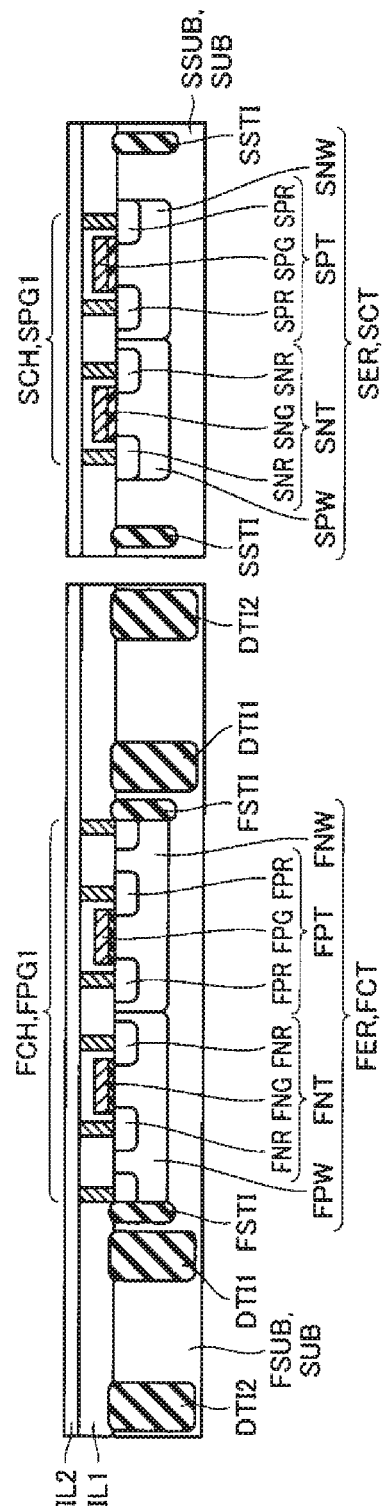
FIG. 11 is a cross-sectional view illustrating a step performed after the step illustrated in FIG. 10 in the embodiment.

Next, a conductive film (not shown) is formed on the interlayer insulating film IL1 so as to fill the contact hole FCH. A conductive film (not shown) is formed on the interlayer insulating film IL1 so as to fill the contact hole SCH. Next, a chemical mechanical polishing process is performed on the conductive film. As a result, as shown in FIG. 11, contact plugs FPG1 are formed in the contact holes FCH. Contact plugs SPG1 are formed in the contact holes SCH.

Figure 12:
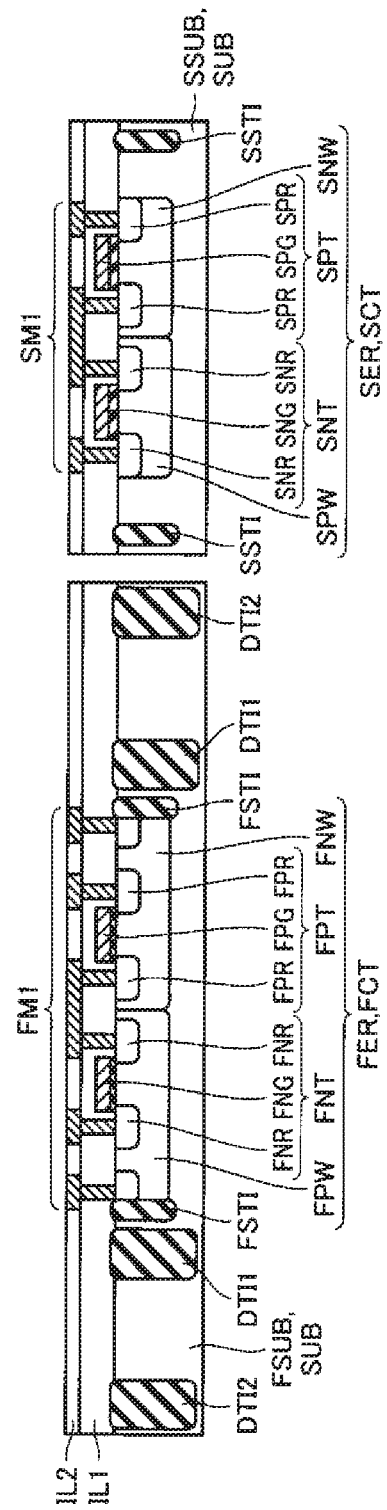
FIG. 12 is a cross-sectional view illustrating steps performed after the steps shown in FIG. 11 in the embodiment.

Next, an interlayer insulating film IL2 is formed so as to cover the interlayer insulating film IL1. Next, wiring trenches are formed in the interlayer insulating film IL2 by the damascene method. Next, as shown in FIG. 12, a wiring FM1 is formed in the wiring trench of the interlayer insulating film IL2 of the first semiconductor substrate FSUB. The wiring SM1 is formed in the wiring trench of the interlayer insulating film IL2 of the second semiconductor substrate SSUB.

Figure 13:
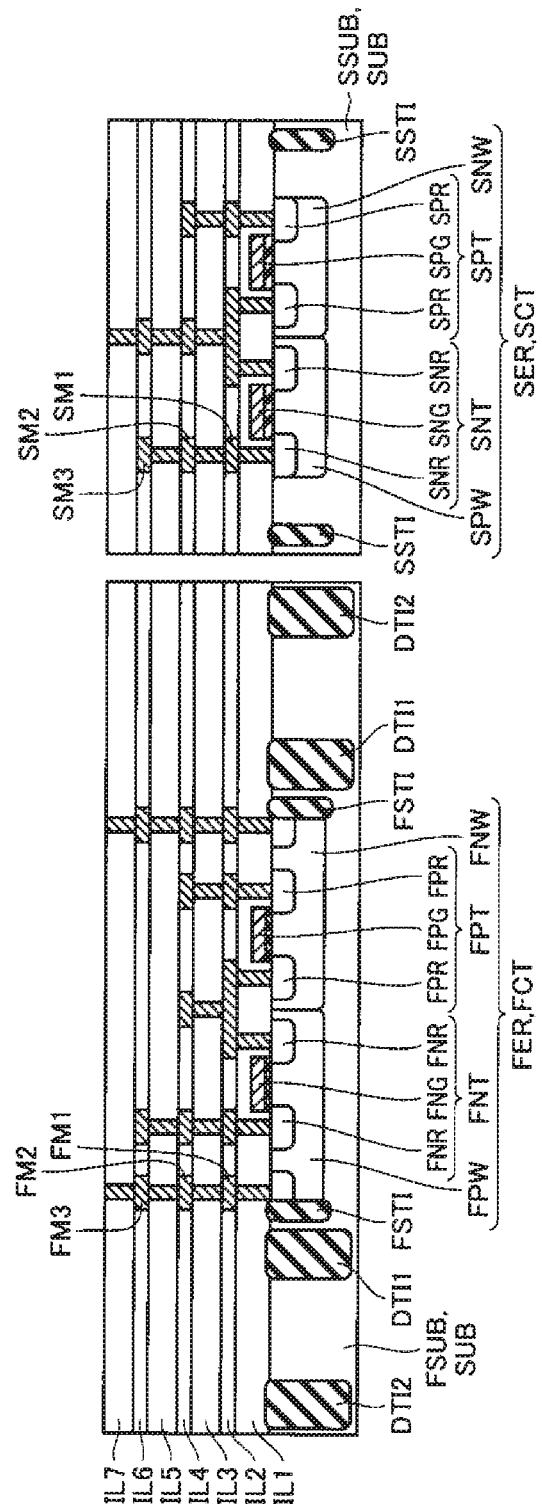
FIG. 13 is a cross-sectional view illustrating steps performed after the steps shown in FIG. 12 in the embodiment.

Next, as shown in FIG. 13, an interlayer insulating film IL3 is formed on the interlayer insulating film IL2 so as to cover the wiring FM1. An interlayer insulating film IL3 is formed on the interlayer insulating film IL2 so as to cover the wiring SM1. Next, plugs penetrating the interlayer insulating film IL3 are formed. Next, an interlayer insulating film IL4 is formed so as to cover the interlayer insulating film IL3. Next, wiring trenches are formed in the interlayer insulating film IL4 by the damascene method. The wiring FM2 is formed in the wiring trench of the interlayer insulating film IL4 of the first semiconductor substrate FSUB. The wiring SM2 is formed in the wiring trench of the interlayer insulating film IL4 of the second semiconductor substrate SSUB.

Next, an interlayer insulating film IL5 is formed on the interlayer insulating film IL4 so as to cover the wiring FM2. An interlayer insulating film IL5 is formed on the interlayer insulating film IL4 so as to cover the wiring SM2. Next, plugs penetrating the interlayer insulating film IL5 are formed. Next, an interlayer insulating film IL6 is formed so as to cover the interlayer insulating film IL5.

Next, wiring trenches are formed in the interlayer insulating film IL6 by the damascene method. The wiring FM3 is formed in the wiring trench of the interlayer insulating film IL6 of the first semiconductor substrate FSUB. The wiring SM3 is formed in the wiring trench of the interlayer insulating film IL6 of the second semiconductor substrate SSUB. Next, an interlayer insulating film IL7 is formed on the interlayer insulating film IL6 so as to cover the wiring FM 3. An interlayer insulating film IL7 is formed on the interlayer insulating film IL6 so as to cover the wiring SM3. Next, plugs penetrating the interlayer insulating film IL7 are formed.

Figure 14:
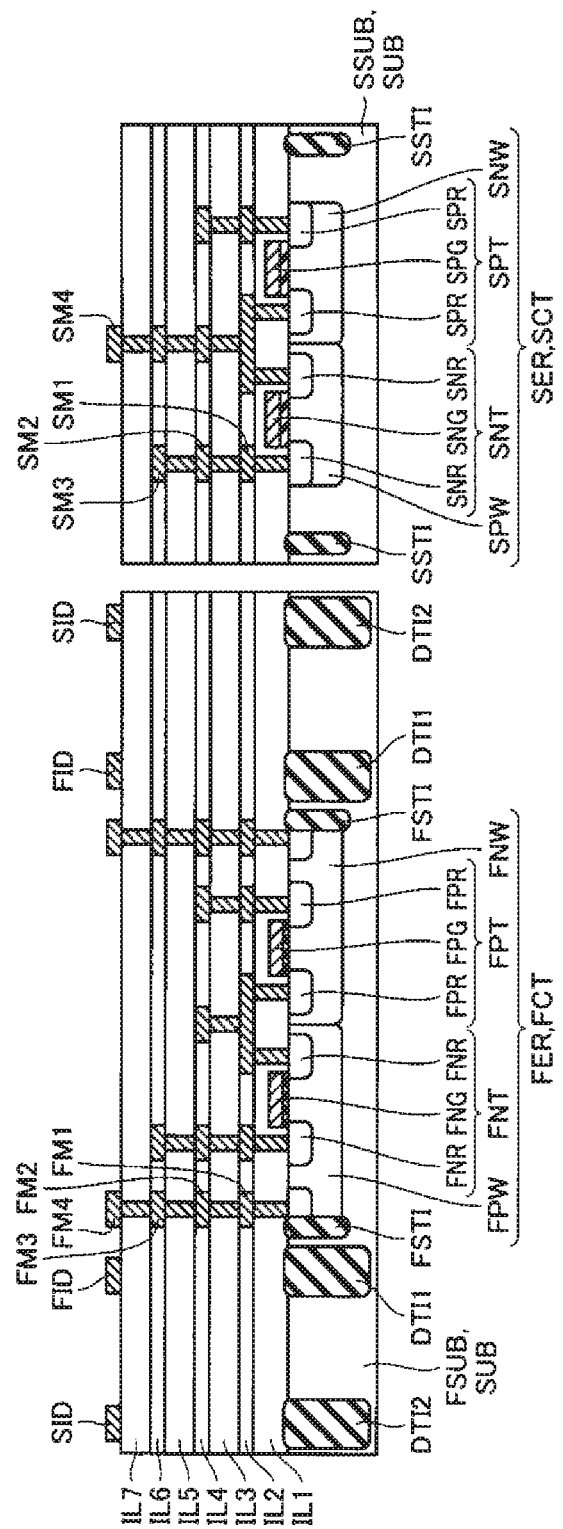
FIG. 14 is a cross-sectional view illustrating a step performed after the step shown in FIG. 13 in the embodiment.

Next, a conductive film (not shown) is formed by, for example, sputtering so as to cover the interlayer insulating film IL7. Next, predetermined photolithography treatment and etching treatment are performed. As a result, as shown in FIG. 14, the wiring FM4, the first inductor FID, and the second inductor SID are formed so as to be in contact with surfaces of the interlayer insulating film IL7 of the first semiconductor substrate FSUB. The wiring SM4 is formed so as to be in contact with the surface of the interlayer insulating film IL7 of the second semiconductor substrate SSUB. The first inductor FID is disposed directly above the first insulator DTI1 formed in the first semiconductor substrate FSUB. The second inductor SID is disposed directly above the second insulator DTI2 formed on the first semiconductor substrate FSUB.

Next, an interlayer insulating film (not shown) is formed on the interlayer insulating film IL7 so as to cover the wiring FM4, the first inductor FID, and the second inductor SID. An interlayer insulating film (not shown) is formed on the interlayer insulating film IL7 so as to cover the wiring SM4. Next, a chemical mechanical polishing process is performed on the interlayer insulating film.

Figure 15:
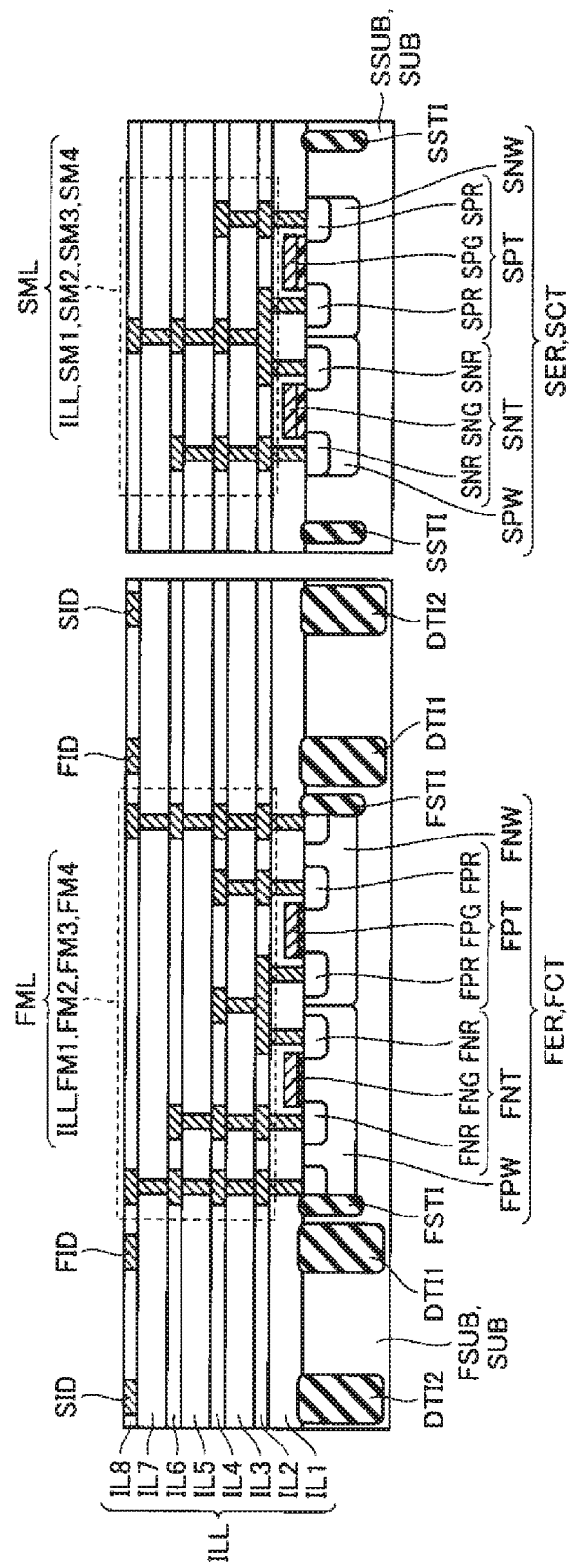
FIG. 15 is a cross-sectional view illustrating a step performed after the step shown in FIG. 14 in the embodiment.

As a result, as shown in FIG. 15, the surfaces of the wiring FM4, the first inductor FID, and the second inductor SID are exposed on the surface of the interlayer insulating film IL8 of the first semiconductor substrate FSUB. The surface of the wiring SM4 is exposed on the surface of the interlayer insulating film IL8 of the second semiconductor substrate SSUB.

The interlayer insulating film IL8 is filled on each side of the wiring FM4, the first inductor FID, and the second inductor SID. The interlayer insulating film IL8 is filled on the side of the wiring SM4. In this manner, the multi-layer wiring structures FML are formed so as to cover the first semiconductor substrate FSUBs. Multi-layer wiring structures SMLs are formed to cover the second semiconductor substrate SSUBs.

Figure 16:
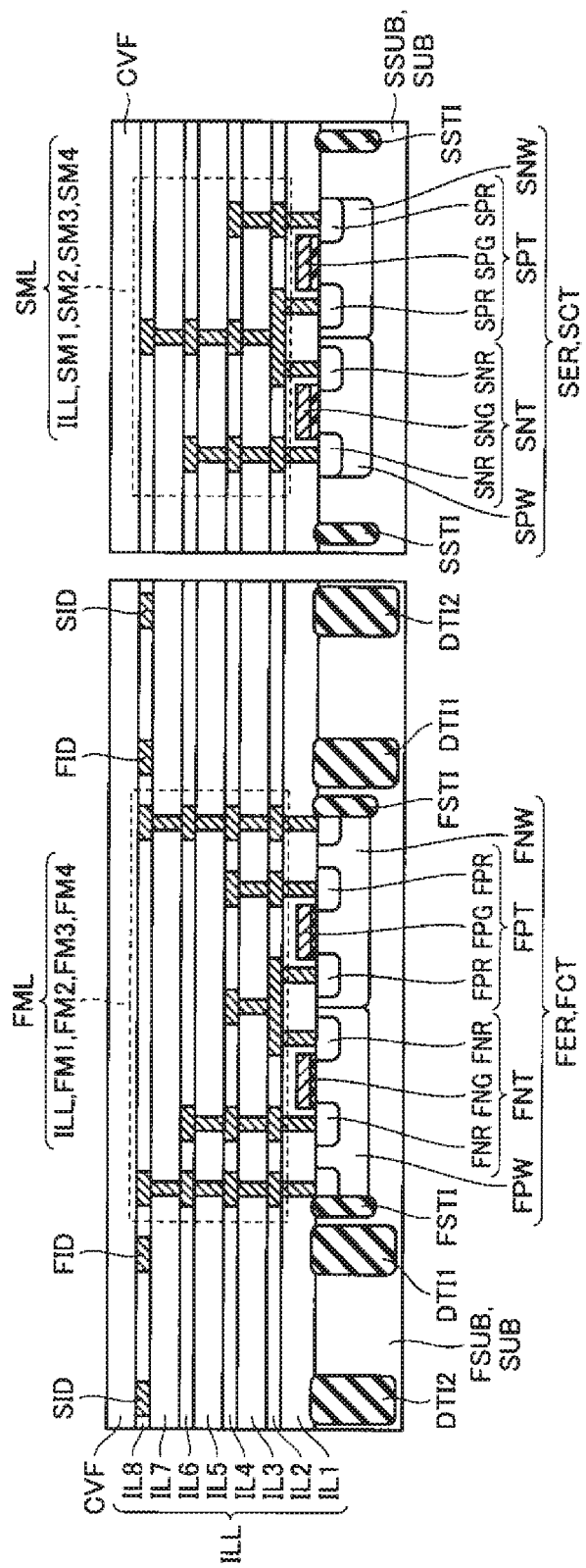
FIG. 16 is a cross-sectional view illustrating a step performed after the step shown in FIG. 15 in the embodiment.

Next, as shown in FIG. 16, a cover film CVF is formed on the interlayer insulating film IL8 by, for example, CVD so as to cover the wiring FM4, the first inductor FID, and the second inductor SID. A cover film CVF is formed on the interlayer insulating film IL8 so as to cover the wiring SM4. Next, predetermined photolithography treatment and etching treatment are performed, respectively.

Figure 17:
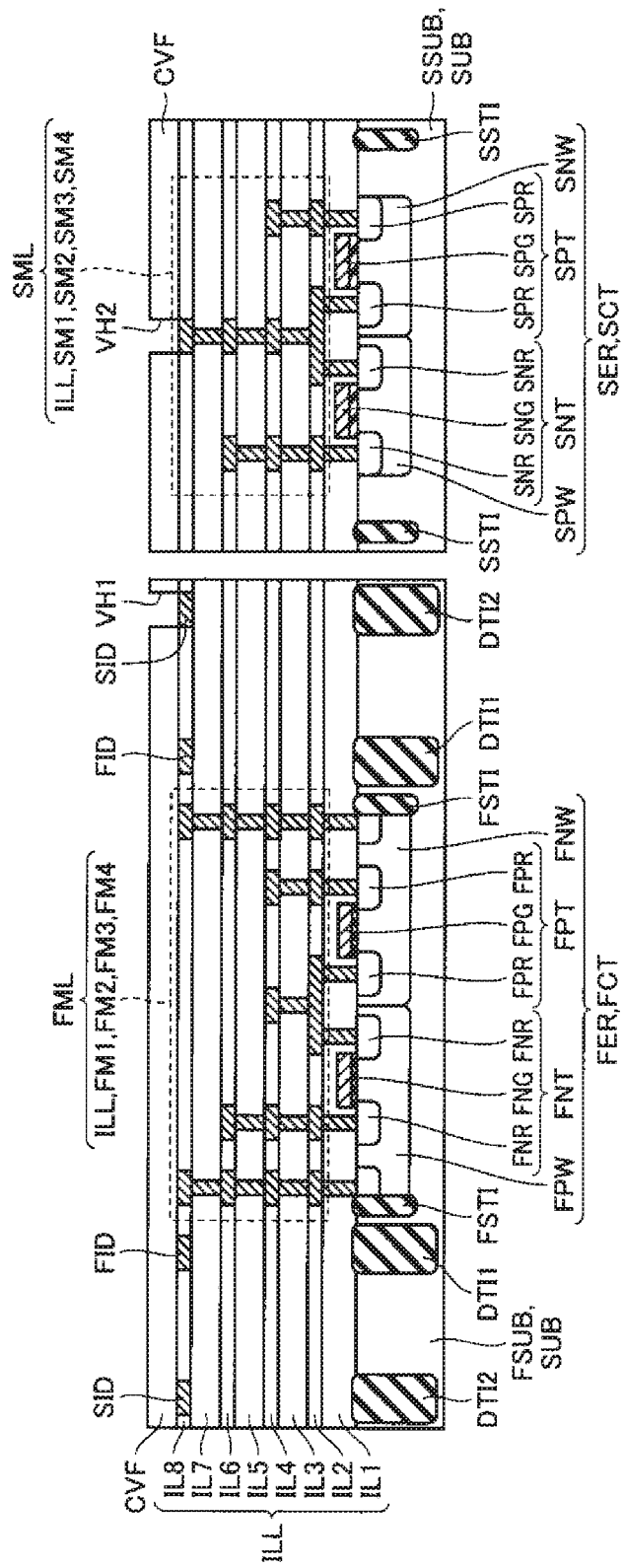
FIG. 17 is a cross-sectional view illustrating a step performed after the step shown in FIG. 16 in the embodiment.

As a result, as shown in FIG. 17, an opening VH1 is formed in the cover film CVF of the first semiconductor substrate FSUB to expose the surface of the second inductor SID. In the cover film CVF of the second semiconductor substrate SSUB, an opening VH2 exposing the surface of the wiring SM4 is formed. In this way, the main part of the first semiconductor chip SCP1 is completed. The main part of the second semiconductor chip SCP2 is completed.

Figure 18:
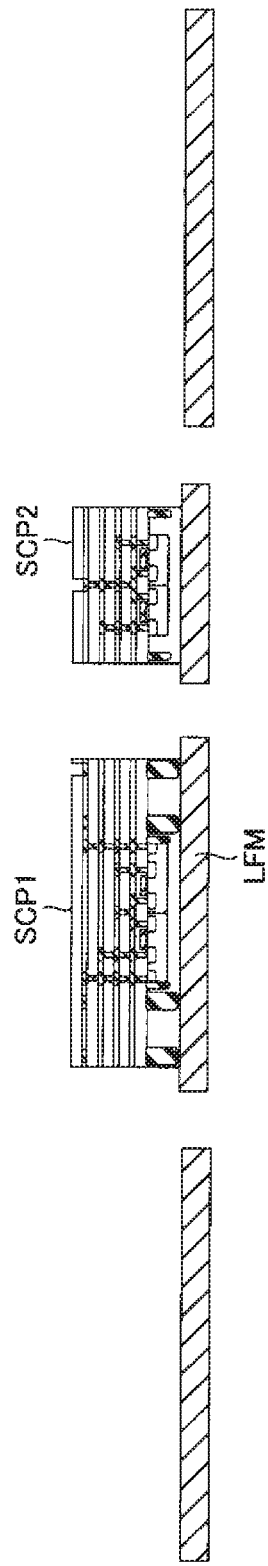
FIG. 18 is a cross-sectional view illustrating a step performed after the step illustrated in FIG. 17 in the embodiment.
Figure 19:
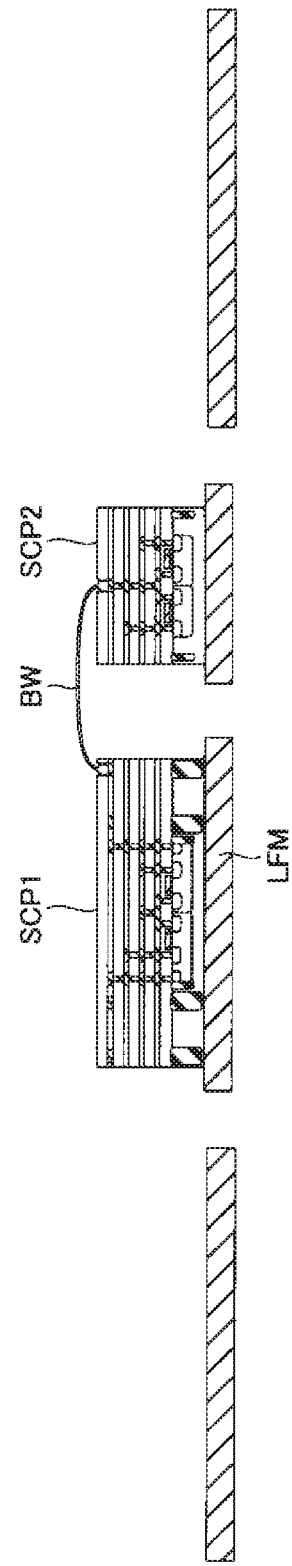
FIG. 19 is a cross-sectional view illustrating a step performed after the step illustrated in FIG. 18 in the embodiment.

Next, as shown in FIG. 18, the first semiconductor chip SCP1 and the second semiconductor chip SCP2 are mounted at predetermined positions in the lead frame LFM, respectively. Next, as shown in FIG. 19, the second inductor SID exposed to the first semiconductor chip SCP (see FIG. 17) and the wiring SM4 exposed to the second semiconductor chip SCP2 (see FIG. 17) are electrically connected through the bonding wire BW.

Figure 20:
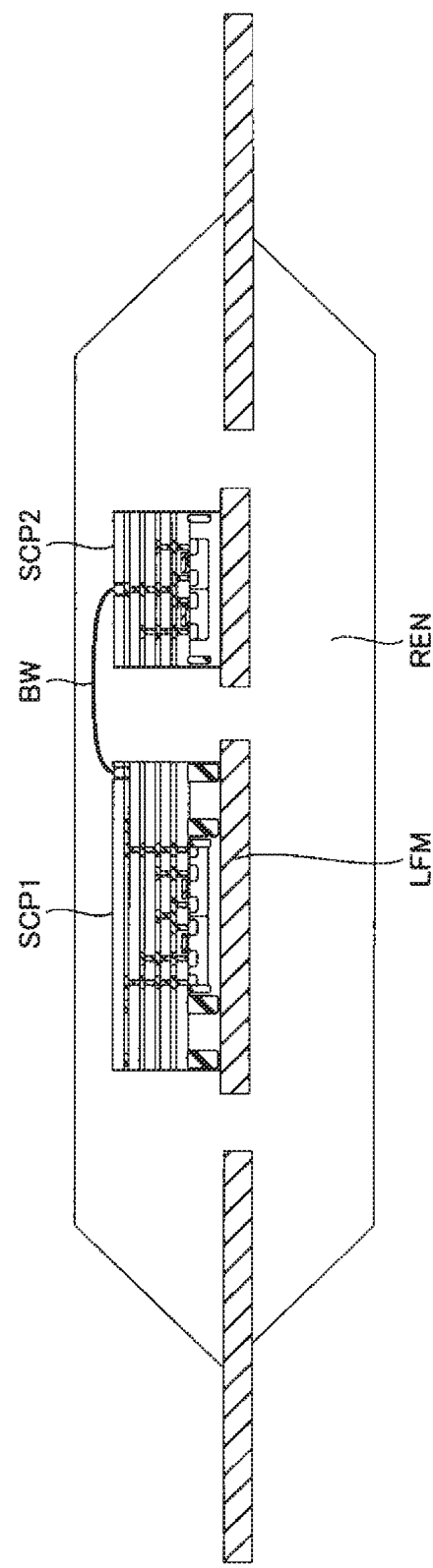
FIG. 20 is a cross-sectional view illustrating a step performed after the step illustrated in FIG. 19 in the embodiment.

Next, as shown in FIG. 20, the first semiconductor chip SCP1, the second semiconductor chip SCP2, and the lead frame LFM are sealed with the sealing resin REN by, for example, a molding method. Thereafter, the semiconductor device SDV shown in FIG. 1 and the like are completed by bending portions of the lead frames LFM protruding from the sealing resins REN.

In the above-described semiconductor device SDV, as shown in FIG. 3, the first inductor FID and the second inductor SID are arranged laterally apart from each other by a distance LL, and the first inductor FID and the second inductor SID are disposed that the first inductor FID and the second inductor SID do not overlap each other and are arranged along each other in plan view (see FIG. 2). The distance LL is set to, for example, several µm to several tens of µm in accordance with the withstand voltage.

As a result, as compared with the semiconductor device according to the comparative example in which the first inductor FID and the second inductor SID are vertically arranged and an interlayer insulating film is interposed therebetween, signals can be transmitted by inductive coupling while ensuring the electric insulating property between the first inductor FID and the second inductor SID without increasing the thickness of the interlayer insulating film.

The inventors calculated coupling coefficients by simulations as a function of the inductive coupling by the first inductor FID and the second inductor SID for the semiconductor device SDV and the semiconductor device according to the comparative examples. The results are shown graphically in FIG. 21. The horizontal axis represents the wiring length ratio of the first inductor disposed inside, and the wiring length of the first inductor of the semiconductor device according to the comparative examples is 1. The vertical axis represents the coupling coefficient ratio, and the coupling coefficient of the semiconductor device according to the comparative examples is 1.

Figure 21:
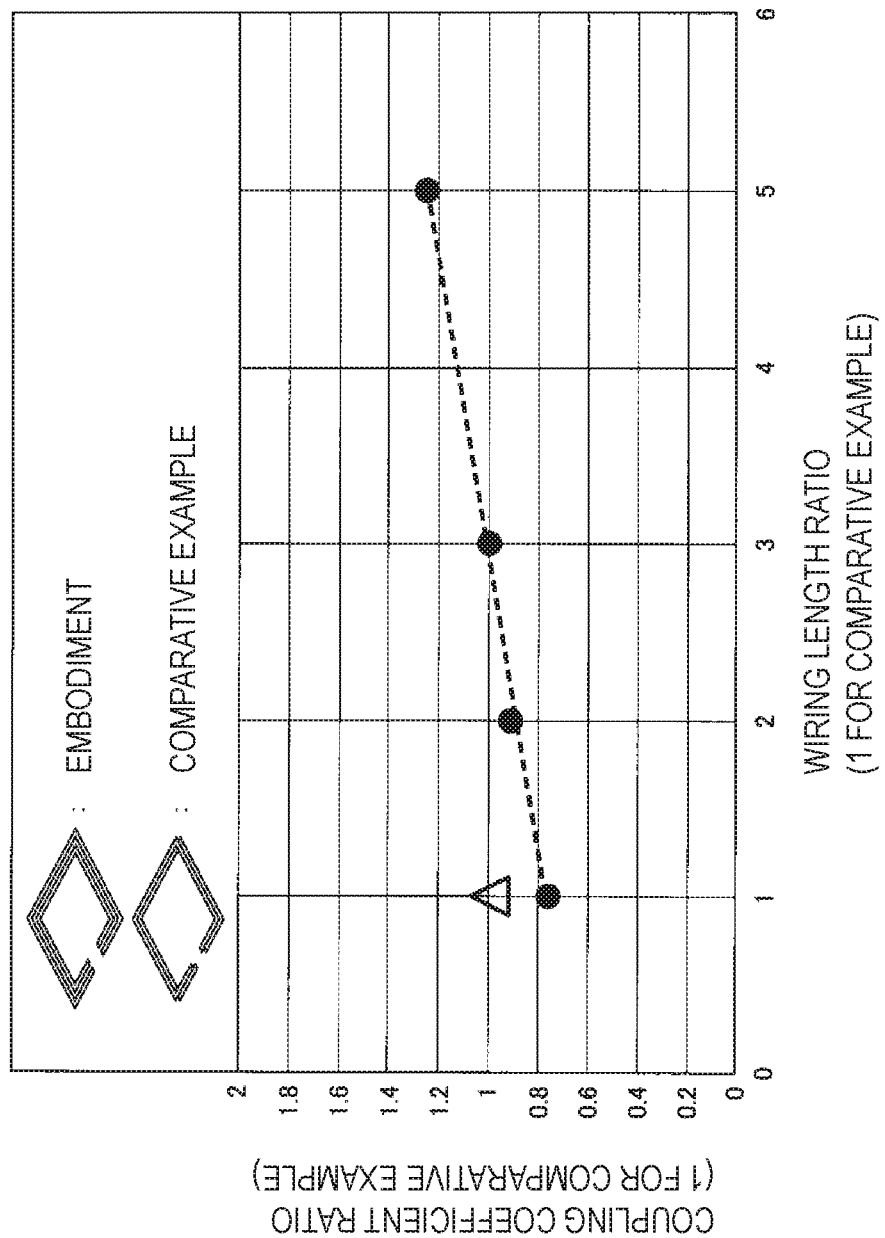
FIG. 21 is a graph showing the relation between a wiring length ratio of the inductor and the coupling factor ratio in the embodiment.

As shown in FIG. 21, when the wiring length ratio is 1, the coupling coefficient of the semiconductor device SDV according to the embodiment is slightly lower than the coupling coefficient of the semiconductor device according to the comparative example, but it is confirmed that there are basically no problems.

In the semiconductor device SDV according to the first embodiment in which the first inductor FID and the second inductor SID are arranged laterally, the lengths of the first inductor FID and the second inductor SID can be set sufficiently long. As a result, it was confirmed that the wiring length of the first inductor FID in the semiconductor device SDV related to first embodiment was about twice the wiring length in the case of the comparative example, and the coupling coefficient was equal to the coupling coefficient in the case of the comparative example.

It was confirmed that when the wiring length of the first inductor FID was set to be longer, the coupling coefficient was greater than that of the comparative example. From the results of the evaluations, it was confirmed that the characteristics of the semiconductor device SDVs as isolators can be ensured.

In the above-described semiconductor device SDVs, a first insulator DTI1 is formed in a part of the semiconductor substrate SUB located immediately below the first inductor FID. A second insulator DTI2 is formed in a part of the semiconductor substrate SUB located directly below the second inductor SID. Thereby, the dielectric strength between the first inductor FID and the semiconductor substrate SUB can be improved, and the dielectric strength between the second inductor SID and the semiconductor substrate SUB can be improved.

Second embodiment here, examples of variations in the arrangement of the first inductor FIDs with respect to the second inductor SID will be described.

Figure 22:
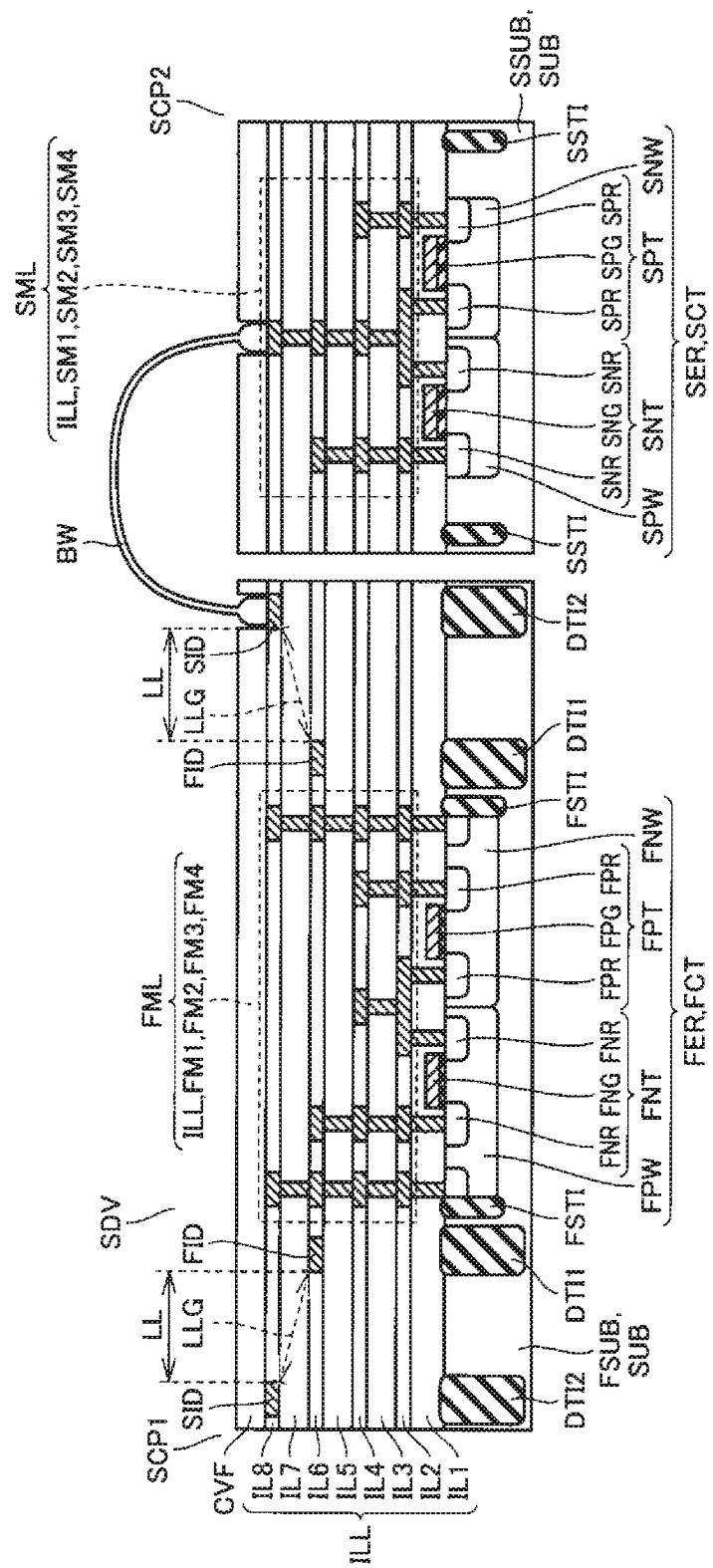
FIG. 22 is a cross-sectional view of a first semiconductor chip and a second semiconductor chip in a semiconductor device according to second embodiment.

As shown in FIG. 22, in the first semiconductor chip SCP1, the second inductor SID is formed in contact with the interlayer insulating film IL7. The first inductor FID is formed in contact with the interlayer insulating film IL5. The distance in the lateral direction between the second inductor SID and the first inductor FID is set to, for example, the distance LL.

Since other configurations are the same as those of the semiconductor device shown in FIG. 3, the same members are denoted by the same reference numerals, and descriptions thereof will not be repeated except when required. As for the semiconductor device SDV, the first semiconductor chip SCP1 and the second semiconductor chip SCP2 are sealed with the sealing resin REN in the same manner as shown in FIG. 1.

Figure 23:
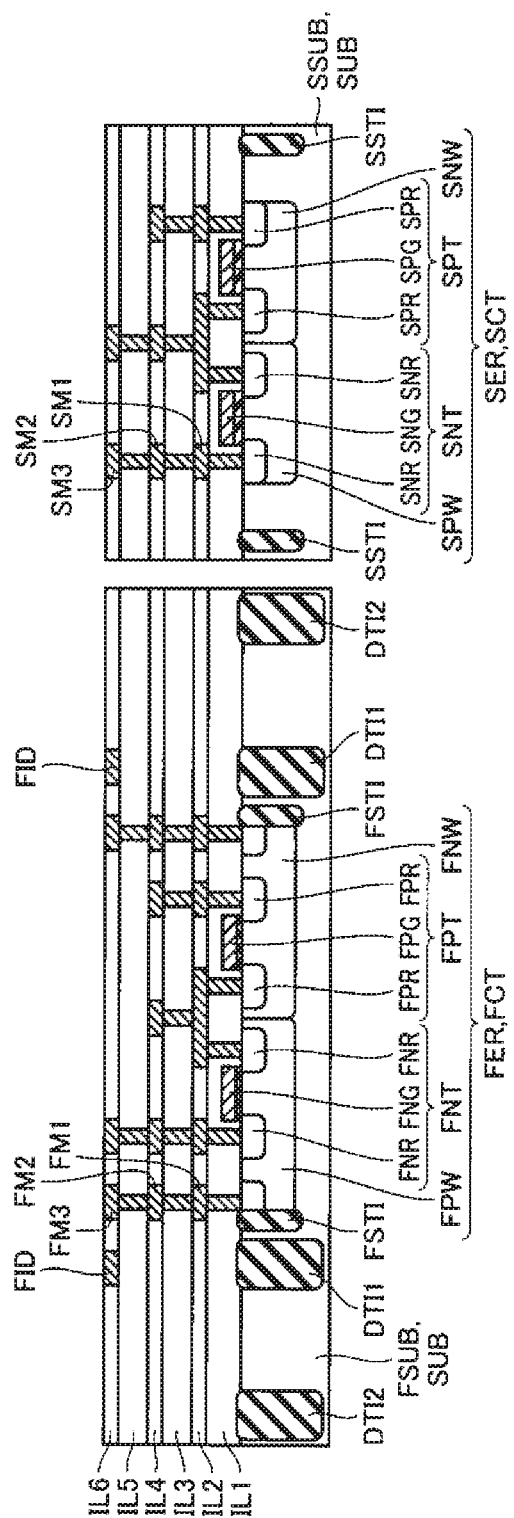
FIG. 23 is a cross-sectional view illustrating one step of the manufacturing method of semiconductor device in the embodiment.

Next, an exemplary manufacturing method of the above-described semiconductor device will be described. After the same steps as those shown in FIGS. 4 to 12 described in the first embodiment are performed, the first inductor FID is formed together with the wiring FM3 in the step shown in FIG. 13. As shown in FIG. 23, wiring trenches are formed in the interlayer insulating film IL6 covering the interlayer insulating film IL5 by the damascene method. The wiring FM3 and the first inductor FID are formed in the wiring trench of the interlayer insulating film IL6 of the first semiconductor substrate FSUB. The wiring SM3 is formed in the wiring trench of the interlayer insulating film IL6 of the second semiconductor substrate SSUB.

Figure 24:
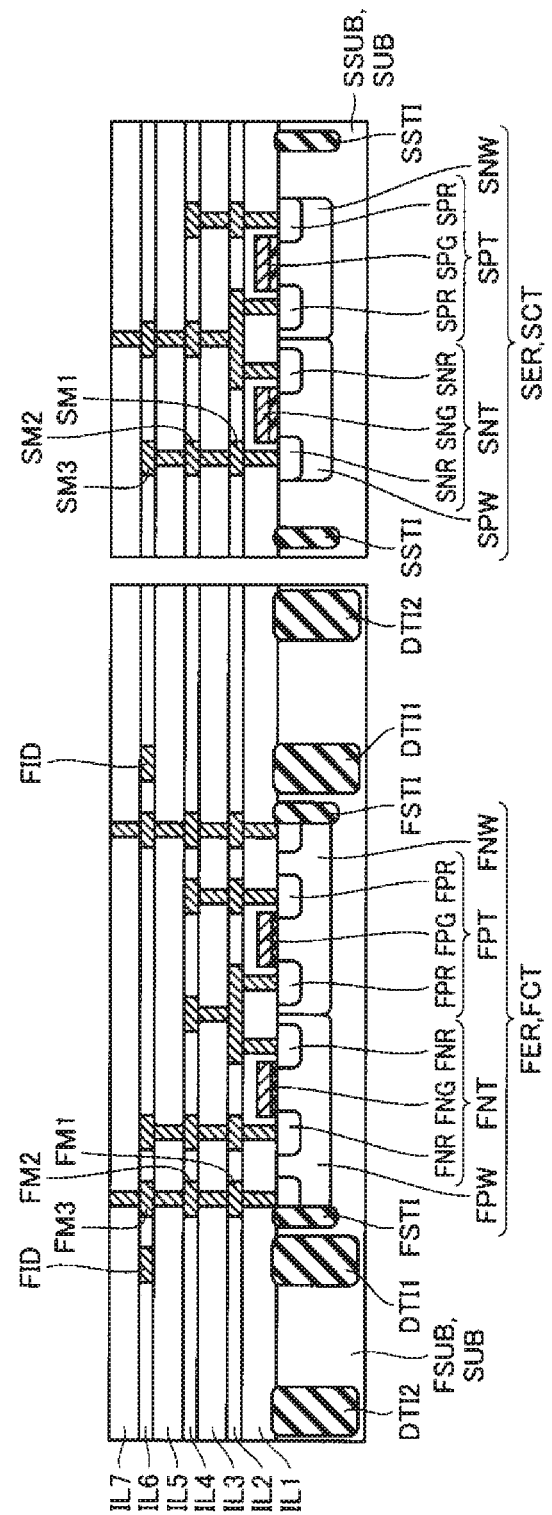
FIG. 24 is a cross-sectional view illustrating a step performed after the step shown in FIG. 23 in the embodiment.
Figure 25:
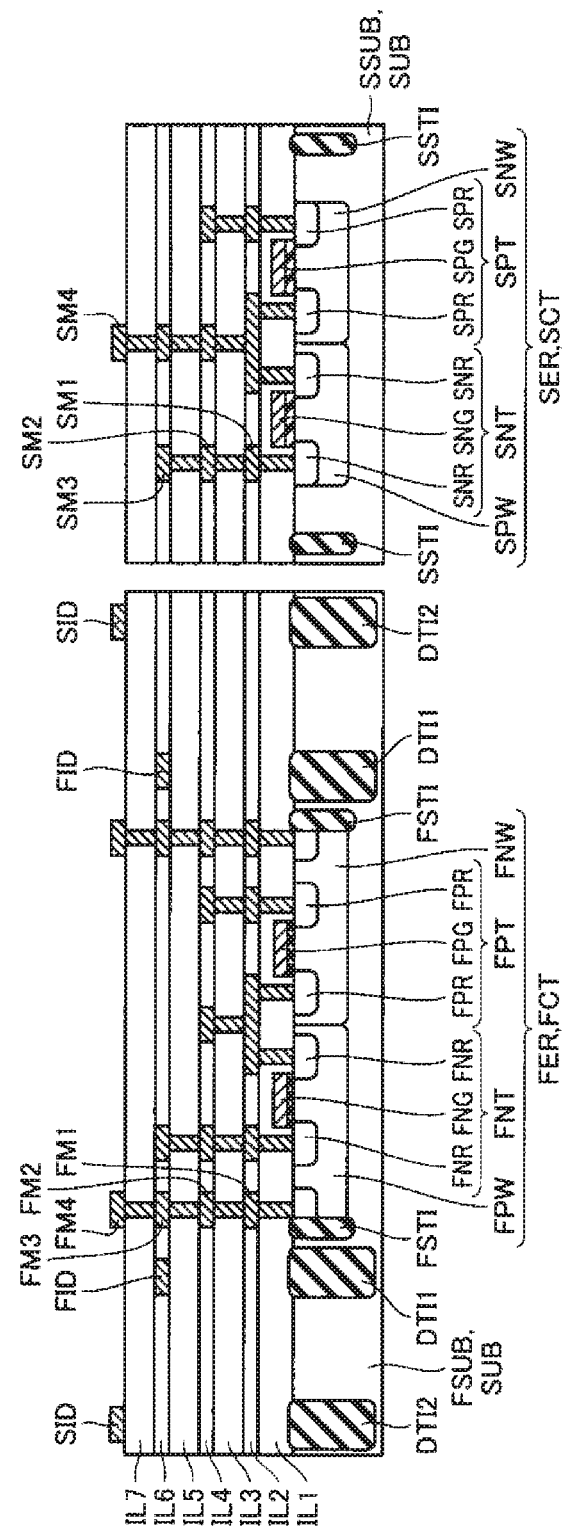
FIG. 25 is a cross-sectional view illustrating a step performed after the step shown in FIG. 24 in the embodiment.

Next, as shown in FIG. 24, an interlayer insulating film IL7 is formed on the interlayer insulating film IL6 so as to cover the first inductor FID and the wiring FM3. An interlayer insulating film IL7 is formed on the interlayer insulating film IL6 so as to cover the wiring SM3. Next, plugs penetrating the interlayer insulating film IL7 are formed. Next, through a process similar to that shown in FIG. 14, as shown in FIG. 25, the wiring FM4 and the second inductor SID are formed so as to be in contact with surfaces of the interlayer insulating film IL7 of the first semiconductor substrate FSUB. The wiring SM4 is formed so as to be in contact with the surface of the interlayer insulating film IL7 of the second semiconductor substrate SSUB.

Figure 26:
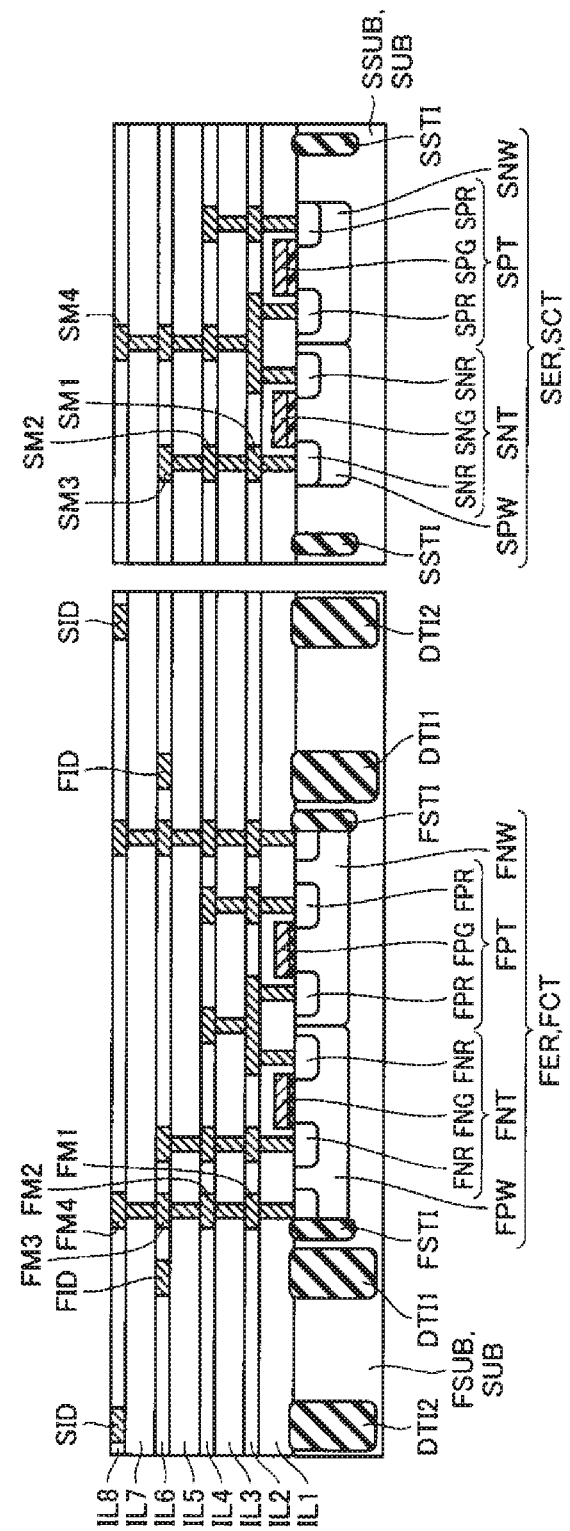
FIG. 26 is a cross-sectional view illustrating steps performed after the steps shown in FIG. 25 in the embodiment.
Figure 27:
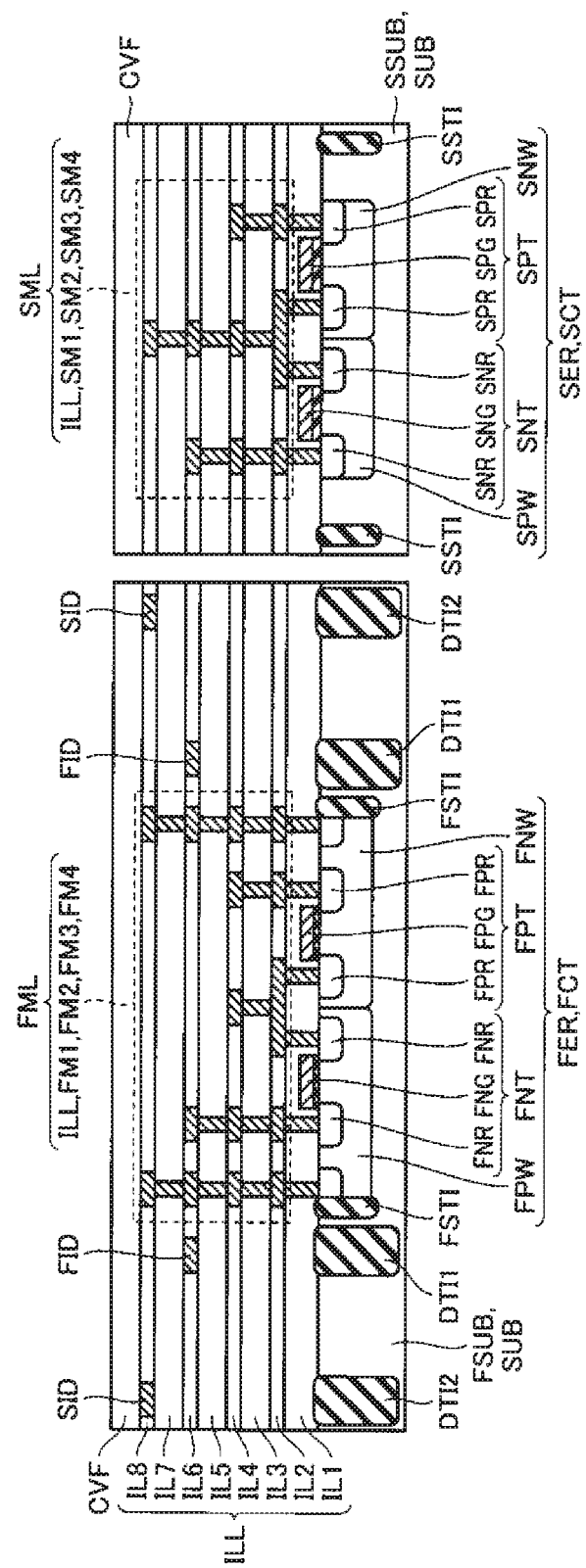
FIG. 27 is a cross-sectional view illustrating steps performed after the steps shown in FIG. 26 in the embodiment.

Next, through the same process as that shown in FIG. 15, the surfaces of the wiring FM4 and the second inductor SID are exposed on the surface of the interlayer insulating film IL8 of the first semiconductor substrate FSUB, as shown in FIG. 26. The surface of the wiring SM4 is exposed on the surface of the interlayer insulating film IL8 of the second semiconductor substrate SSUB. Next, through a step similar to the step shown in FIG. 16, as shown in FIG. 27, a cover film CVF is formed on the interlayer insulating film IL8 so as to cover the wiring FM4 and the second inductor SID. A cover film CVF is formed on the interlayer insulating film IL8 so as to cover the wiring SM4.

Figure 28:
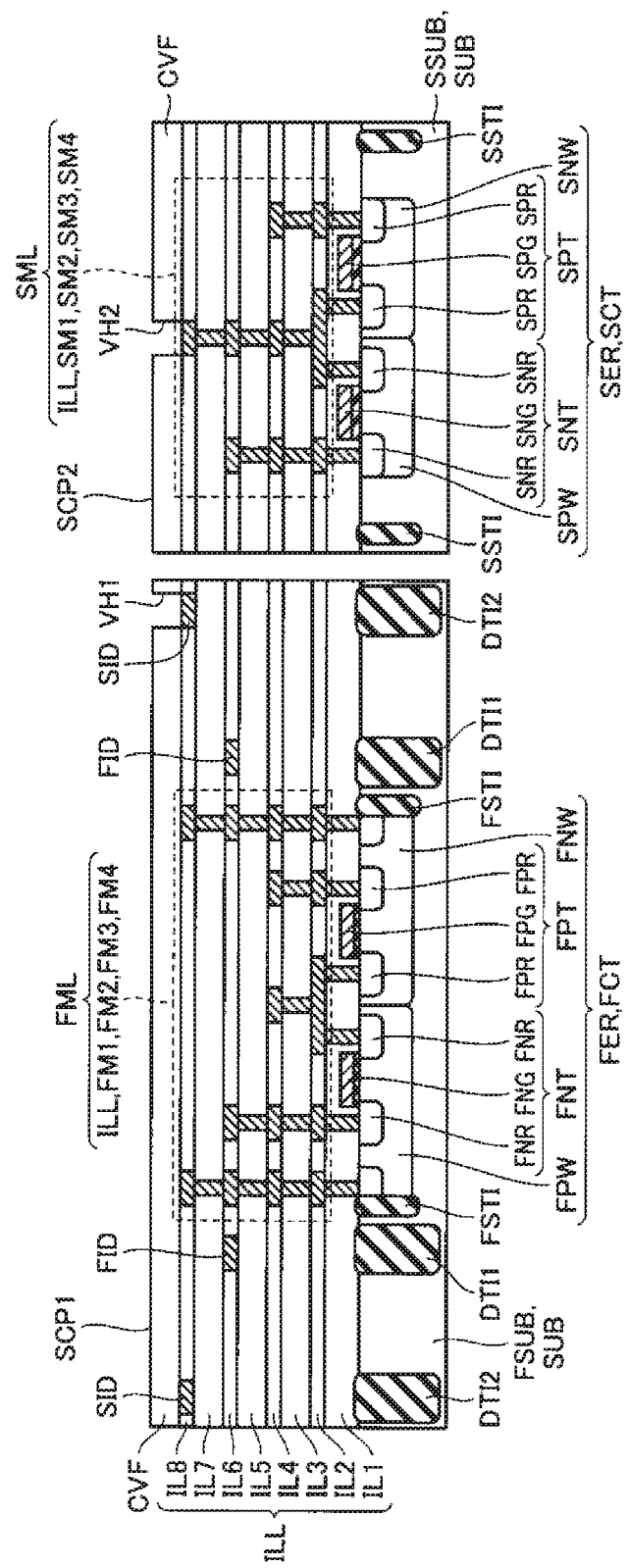
FIG. 28 is a cross-sectional view illustrating a step performed after the step shown in FIG. 27 in the embodiment.

Next, predetermined photolithography treatment and etching treatment are performed, respectively. As a result, as shown in FIG. 28, an opening VH1 is formed in the cover film CVF of the first semiconductor substrate FSUB to expose the surface of the second inductor SID. In the cover film CVF of the second semiconductor substrate SSUB, an opening VH2 exposing the surface of the wiring SM4 is formed. In this way, the main part of the first semiconductor chip SCP1 is completed. The main part of the second semiconductor chip SCP2 is completed. Thereafter, the semiconductor device SDV shown in FIG. 22 is completed through the same steps as those shown in FIGS. 18 to 20.

In addition to the effects described in the first embodiment, the semiconductor device SDVs described above have the following effects. As shown in FIG. 22, in the semiconductor device SDV, the first inductor FID and the second inductor SID are disposed such that the first inductor FID and the second inductor SID do not overlap each other and are arranged along each other in plan view. The first inductor FID is disposed on the semiconductor substrate SUB-side by the thickness of the interlayer insulating film IL7 with respect to the second inductor SID.

Accordingly, when the distance in the lateral direction between the first inductor FID and the second inductor SID is set to the distance LL, the substantial distance LLG between the first inductor FID and the second inductor SID becomes longer than the distance LL. As a result, a signal can be transmitted by inductive coupling while more reliably ensuring electrical insulation between the first inductor FID and the second inductor SID.

On the other hand, when the substantial distance LLG between the first inductor FID and the second inductor SID is set to the same distance as the distance LL, the lateral distance between the first inductor FID and the second inductor SID becomes shorter than the initial distance LL. Therefore, this can contribute to miniaturization of the semiconductor device.

Third embodiment here, other example of variation in the arrangement of the first inductor FID with respect to the second inductor SID will be described.

Figure 29:
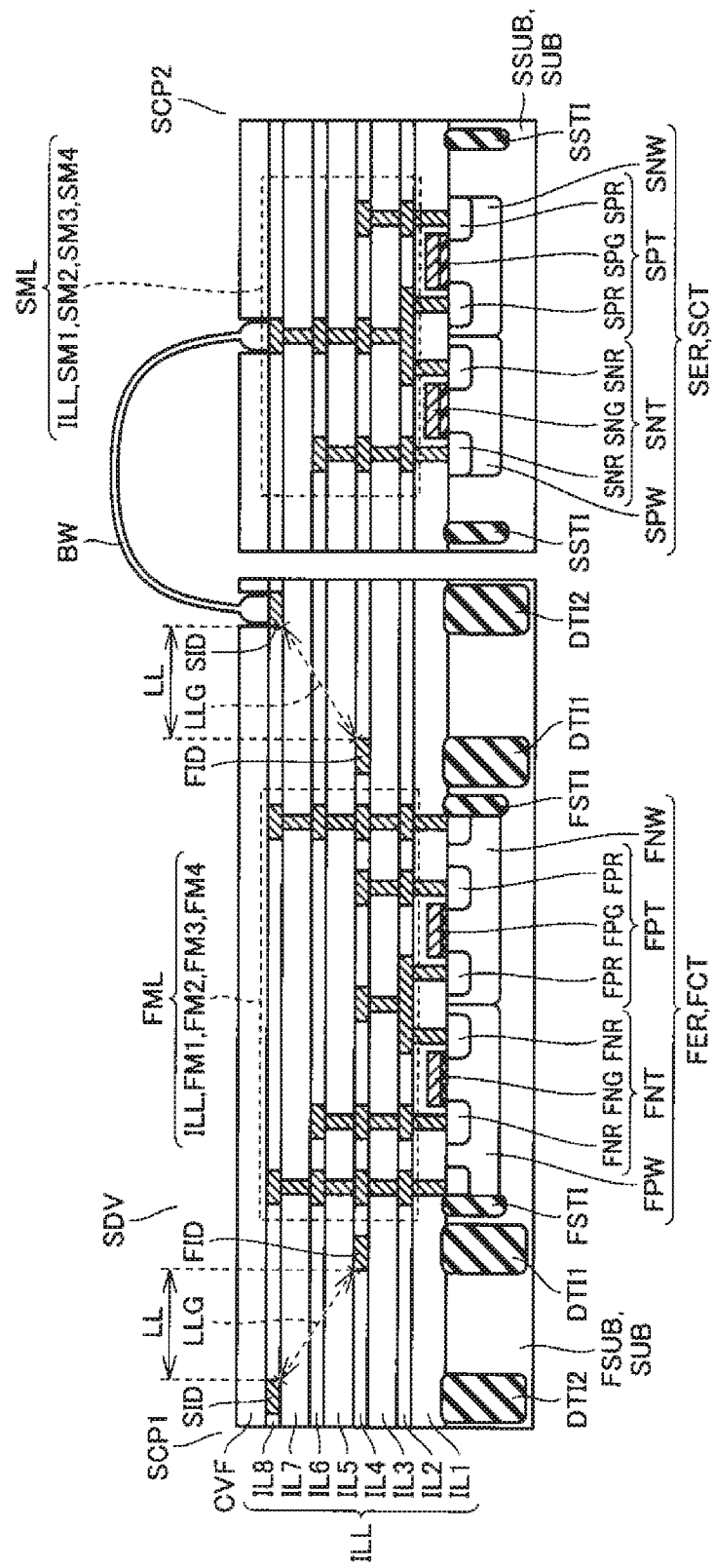
FIG. 29 is a cross-sectional view of a first semiconductor chip and a second semiconductor chip in a semiconductor device according to third embodiment.

As shown in FIG. 29, in the first semiconductor chip SCP1, the second inductor SID is formed in contact with the interlayer insulating film IL7. The first inductor FID is formed in contact with the interlayer insulating film IL4. The distance in the lateral direction between the second inductor SID and the first inductor FID is set to, for example, the distance LL.

Since other configurations are the same as those of the semiconductor device shown in FIG. 3, the same members are denoted by the same reference numerals, and descriptions thereof will not be repeated except when required. As for the semiconductor device SDVs, the first semiconductor chip SCP1 and the second semiconductor chip SCP2 are sealed with the sealing resin REN in the same manner as shown in FIG. 1.

Figure 30:
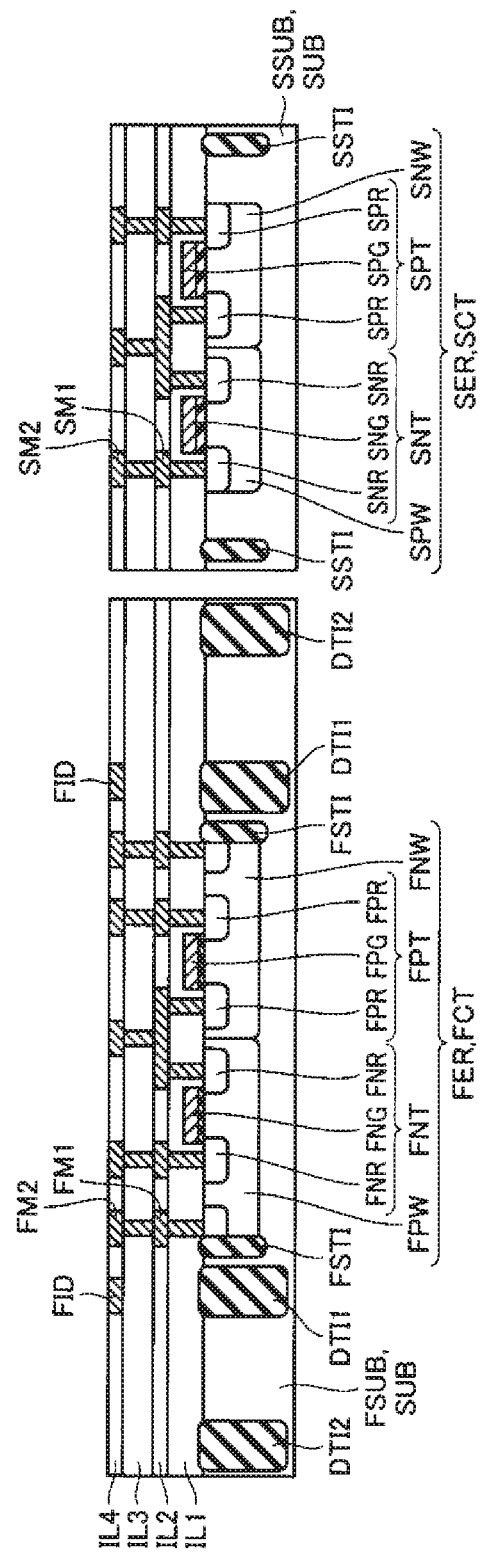
FIG. 30 is a cross-sectional view illustrating one step of the manufacturing method of semiconductor device in the embodiment.

Next, an exemplary manufacturing method of the above-described semiconductor device will be described. After the same steps as those shown in FIGS. 4 to 12 described in the first embodiment are performed, the first inductor FID is formed together with the wiring FM2 in the step shown in FIG. 13. As shown in FIG. 30, wiring trenches are formed in the interlayer insulating film IL4 covering the interlayer insulating film IL3 by the damascene method. The wiring FM2 and the first inductor FID are formed in the wiring trench of the interlayer insulating film IL4 of the first semiconductor substrate FSUB. The wiring SM2 is formed in the wiring trench of the interlayer insulating film IL4 of the second semiconductor substrate SSUB.

Figure 31:
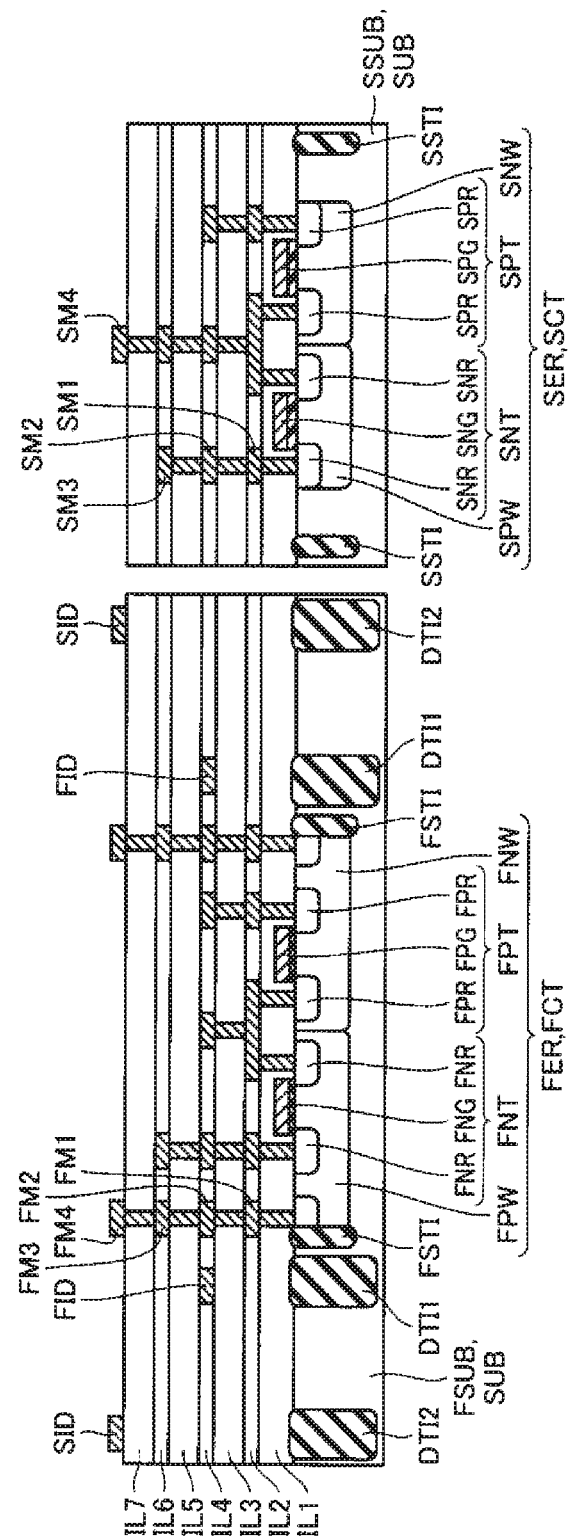
FIG. 31 is a cross-sectional view illustrating steps performed after the steps shown in FIG. 30 in the embodiment.

Next, through a process similar to that shown in FIG. 14, as shown in FIG. 31, the wiring FM4 and the second inductor SID are formed so as to be in contact with surfaces of the interlayer insulating film IL7 of the first semiconductor substrate FSUB. The wiring SM4 is formed so as to be in contact with the surface of the interlayer insulating film IL7 of the second semiconductor substrate SSUB.

Figure 32:
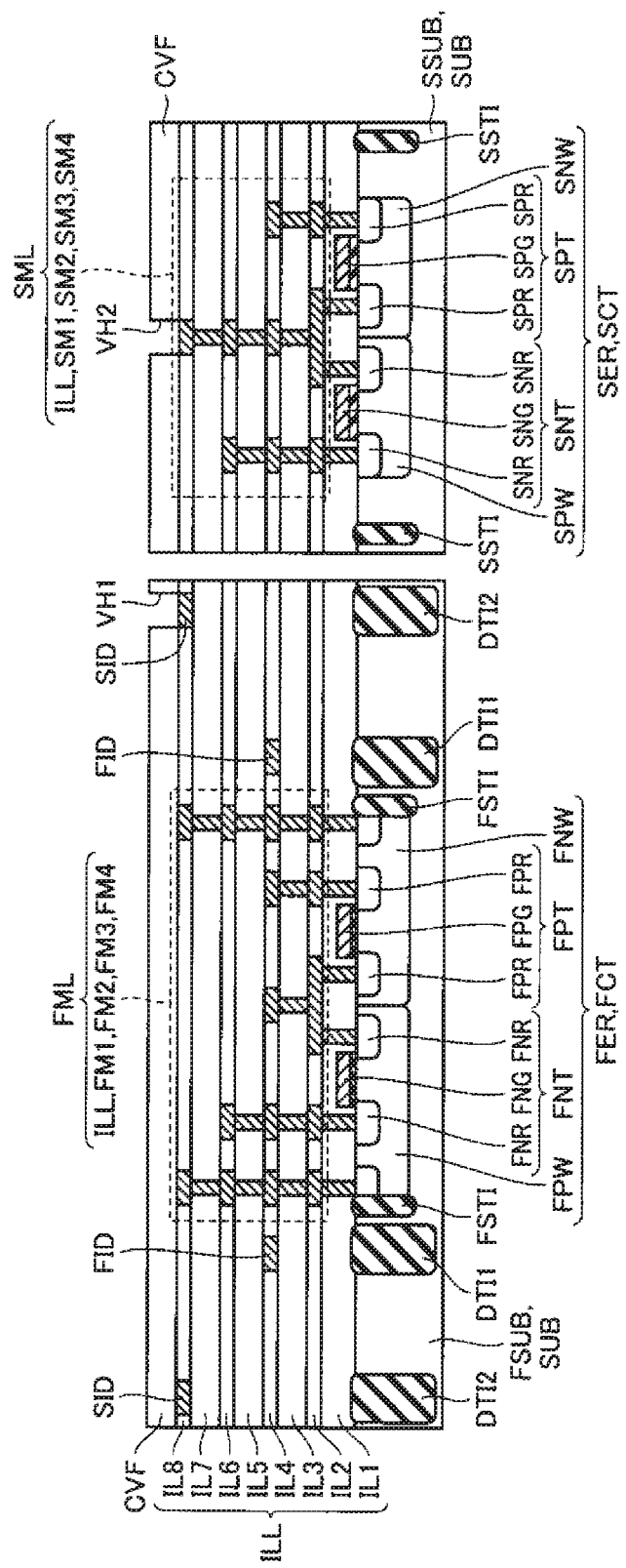
FIG. 32 is a cross-sectional view illustrating steps performed after the steps shown in FIG. 31 in the embodiment.

Next, through the same steps as those shown in FIGS. 15 to 17, as shown in FIG. 32, an opening VH1 exposing the front surface of the second inductor SID is formed in the cover film CVF of the first semiconductor substrate FSUB. In the cover film CVF of the second semiconductor substrate SSUB, an opening VH2 exposing the surface of the wiring SM4 is formed. In this way, the main part of the first semiconductor chip SCP1 is completed. The main part of the second semiconductor chip SCP2 is completed. Thereafter, the semiconductor device SDVs shown in FIG. 29 are completed through the same steps as those shown in FIGS. 18 to 20.

In addition to the effects described in the first embodiment, the semiconductor device SDV described above have the following effects. As shown in FIG. 29, in the semiconductor device SDV, the first inductor FID and the second inductor SID are disposed that the first inductor FID and the second inductor SID do not overlap each other and are arranged along each other in plan view. The first inductor FID is disposed on the semiconductor substrate SUB-side of the second inductor SID by the thickness of the interlayer insulating films IL5 and IL6 and the thickness of the IL7.

Accordingly, when the distance in the lateral direction between the first inductor FID and the second inductor SID is set to the distance LL, the substantial distance LLG between the first inductor FID and the second inductor SID becomes longer than the distance LL. As a result, a signal can be transmitted by inductive coupling while further reliably ensuring electrical insulation between the first inductor FID and the second inductor SID.

On the other hand, when the substantial distance between the first inductor FID and the second inductor SID is set to the same distance as the distance LL, the lateral distance between the first inductor FID and the second inductor SID is further shorter than the initial distance LL. Therefore, this can contribute to further miniaturization of the semiconductor device.

In the semiconductor device SDV described above, the first inductor FID is disposed in contact with the surface of the interlayer insulating film IL3, but the first inductor FID may be disposed in contact with the surface of the interlayer insulating film IL1. This can further improve the electrically insulating property between the first inductor FID and the second inductor SID, or contribute to further miniaturization of the semiconductor device.

Fourth embodiment here, examples of structures capable of securing creeping distances between the first inductor FID and the second inductor SID will be described.

Figure 33:
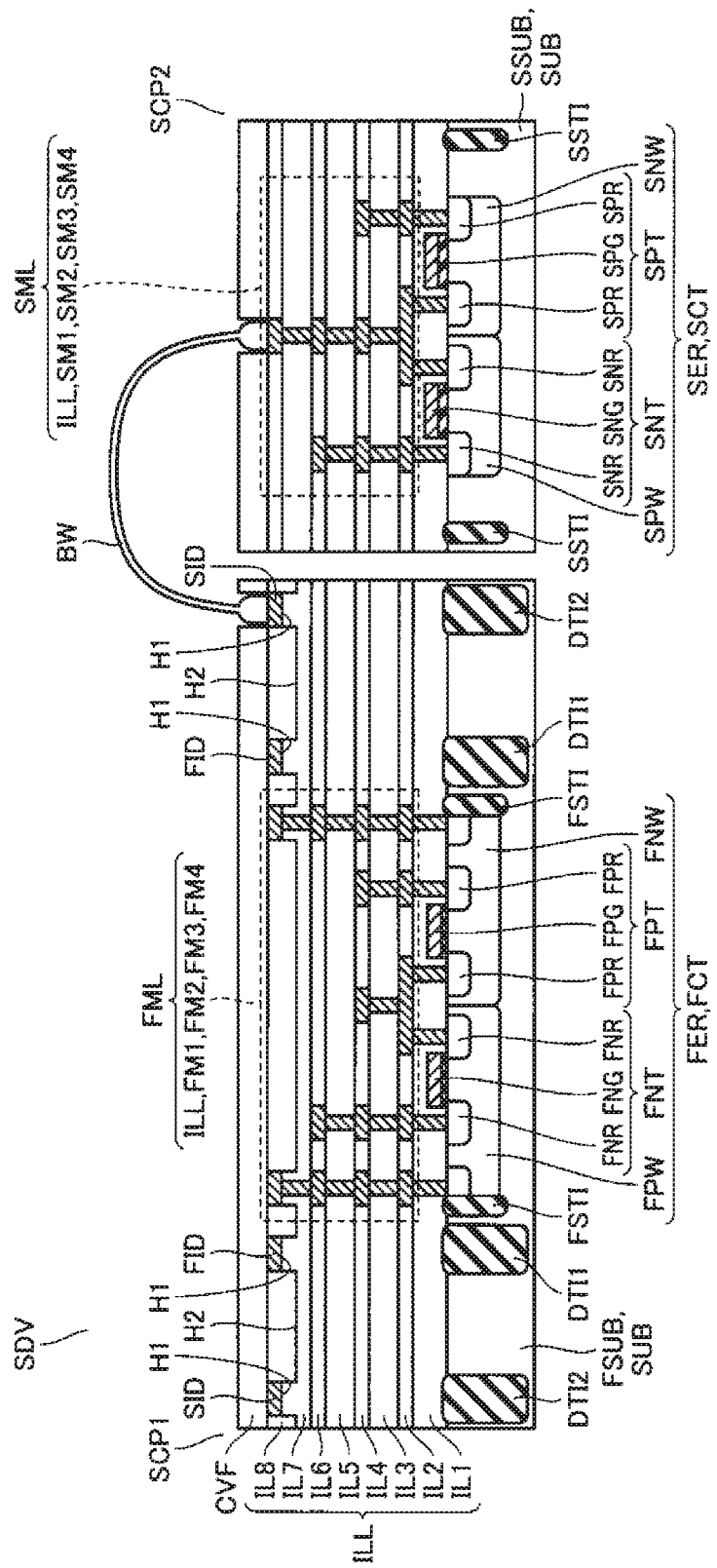
FIG. 33 is a cross-sectional view of a first semiconductor chip and a second semiconductor chip in a semiconductor device according to fourth embodiment.

As shown in FIG. 33, in the first semiconductor chip SCP1 of the semiconductor device SDV, the position of the surface H2 of the portion of the interlayer insulating film IL7 located between the first inductor FID and the second inductor SID recedes toward the semiconductor substrate SUB with respect to the position of the surface H1 of the portion of the interlayer insulating film IL7 where each of the first inductor FID and the second inductor SID is located.

That is, the position of the interface (surface H2) between the portion of the interlayer insulating film IL7 located between the first inductor FID and the second inductor SID and the interlayer insulating film IL8 recedes toward the semiconductor substrate SUB with respect to the position of the interface (surface H1) between the first inductor FID or the second inductor SID and the portion of the interlayer insulating film IL7. Since other configurations are the same as those of the semiconductor device shown in FIG. 3, the same members are denoted by the same reference numerals, and descriptions thereof will not be repeated except when required.

Figure 34:
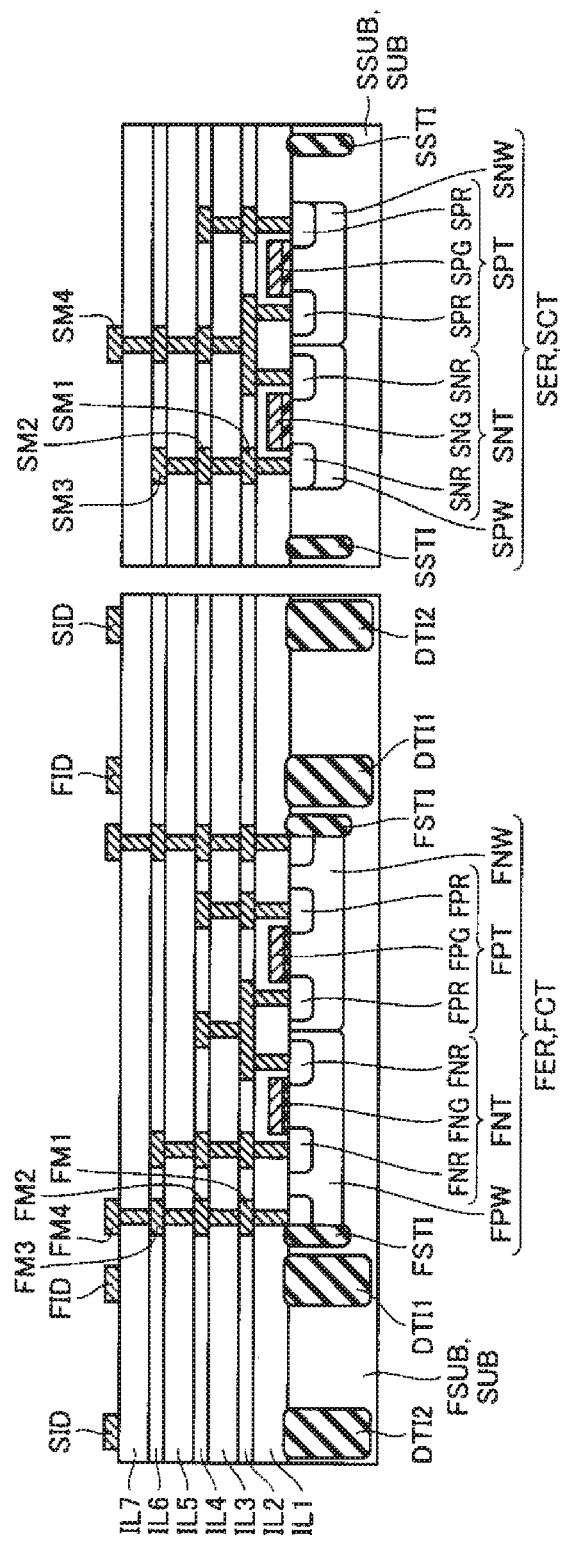
FIG. 34 is a cross-sectional view illustrating one step of the manufacturing method of semiconductor device in the embodiment.

Next, an example of the manufacturing method of the semiconductor device SDV described above will be described. Through the same steps as those shown in FIGS. 4 to 14, as shown in FIG. 34, the wiring FM4, the first inductor FID, and the second inductor SID are formed so as to be in contact with surfaces of the interlayer insulating film IL7 of the first semiconductor substrate FSUB. The wiring SM4 is formed so as to be in contact with the surface of the interlayer insulating film IL7 of the second semiconductor substrate SSUB. At this time, an over-etching treatment is further performed on the interlayer insulating film IL7 of the first semiconductor substrate FSUB.

Figure 35:
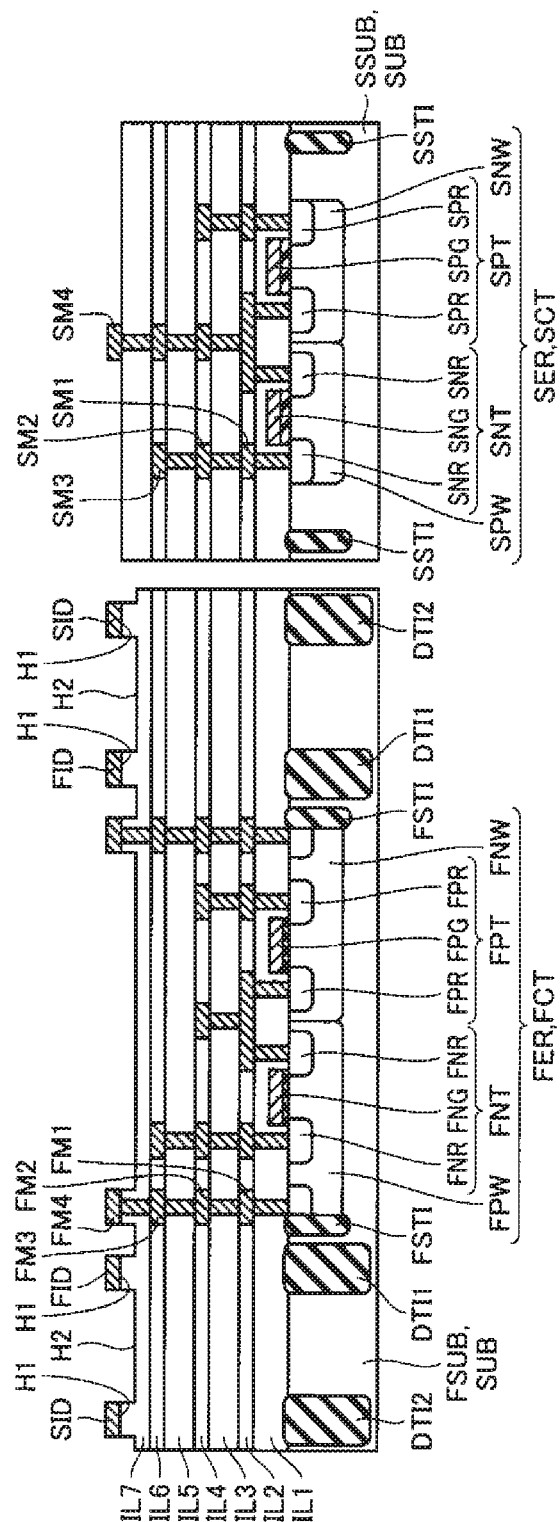
FIG. 35 is a cross-sectional view illustrating steps performed after the steps shown in FIG. 34 in the embodiment.

As a result, as shown in FIG. 35, the position of the surface H2 of the portion of the interlayer insulating film IL7 located between the first inductor FID and the second inductor SID retreats toward the semiconductor substrate SUB with respect to the position of the surface H1 of the portion of the interlayer insulating film IL7 where each of the first inductor FID and the second inductor SID is located.

Figure 36:
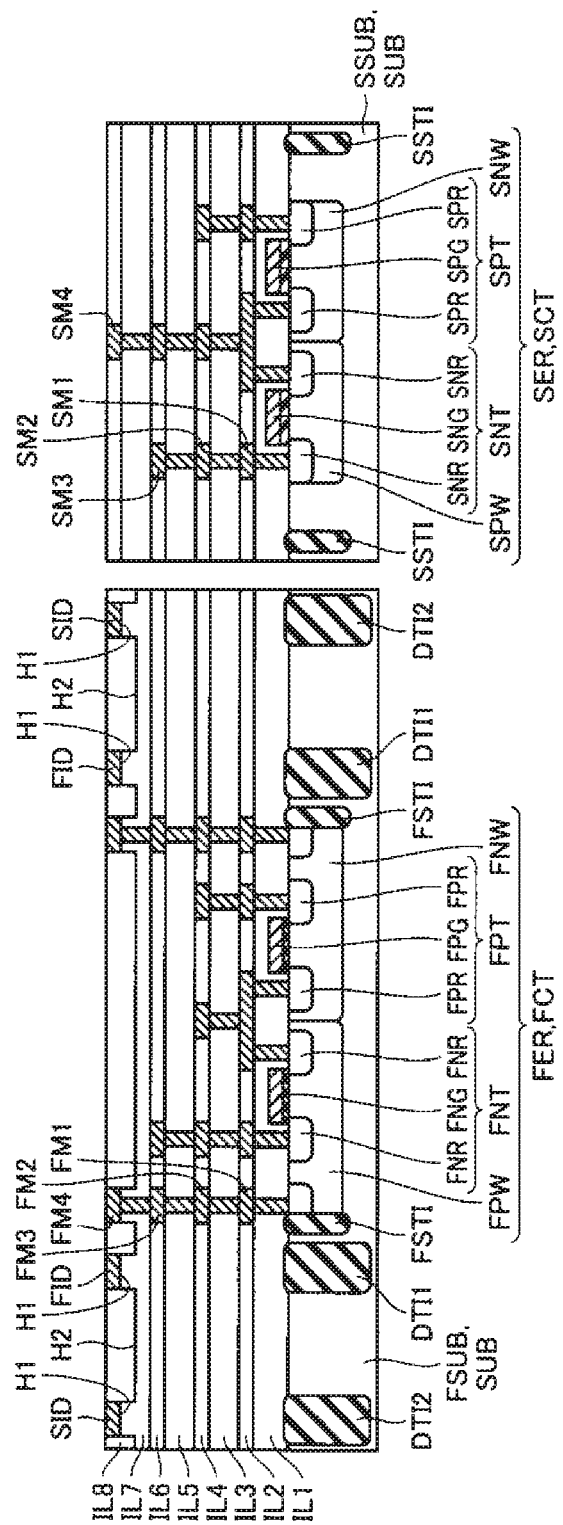
FIG. 36 is a cross-sectional view illustrating a step performed after the step shown in FIG. 35 in the embodiment.
Figure 37:
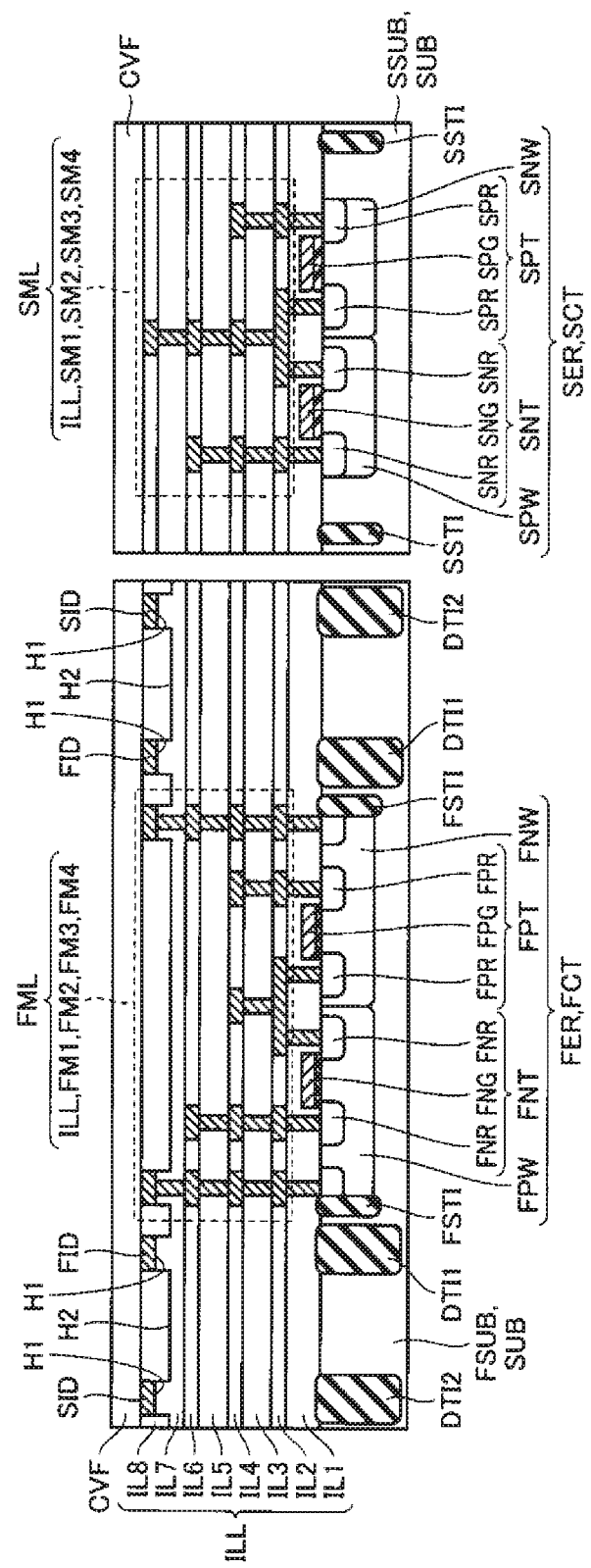
FIG. 37 is a cross-sectional view illustrating steps performed after the steps shown in FIG. 36 in the embodiment.

Next, as shown in FIG. 36, an interlayer insulating film IL8 is formed so as to fill a space between the first inductor FID and the second inductor SID. Next, through a process similar to the process shown in FIG. 16, as shown in FIG. 37, a cover film CVF is formed on the interlayer insulating film IL8 so as to cover the wiring FM4, the first inductor FID, and the second inductor SID. A cover film CVF is formed on the interlayer insulating film IL8 so as to cover the wiring SM4. Next, predetermined photolithography treatment and etching treatment are performed, respectively.

Figure 38:
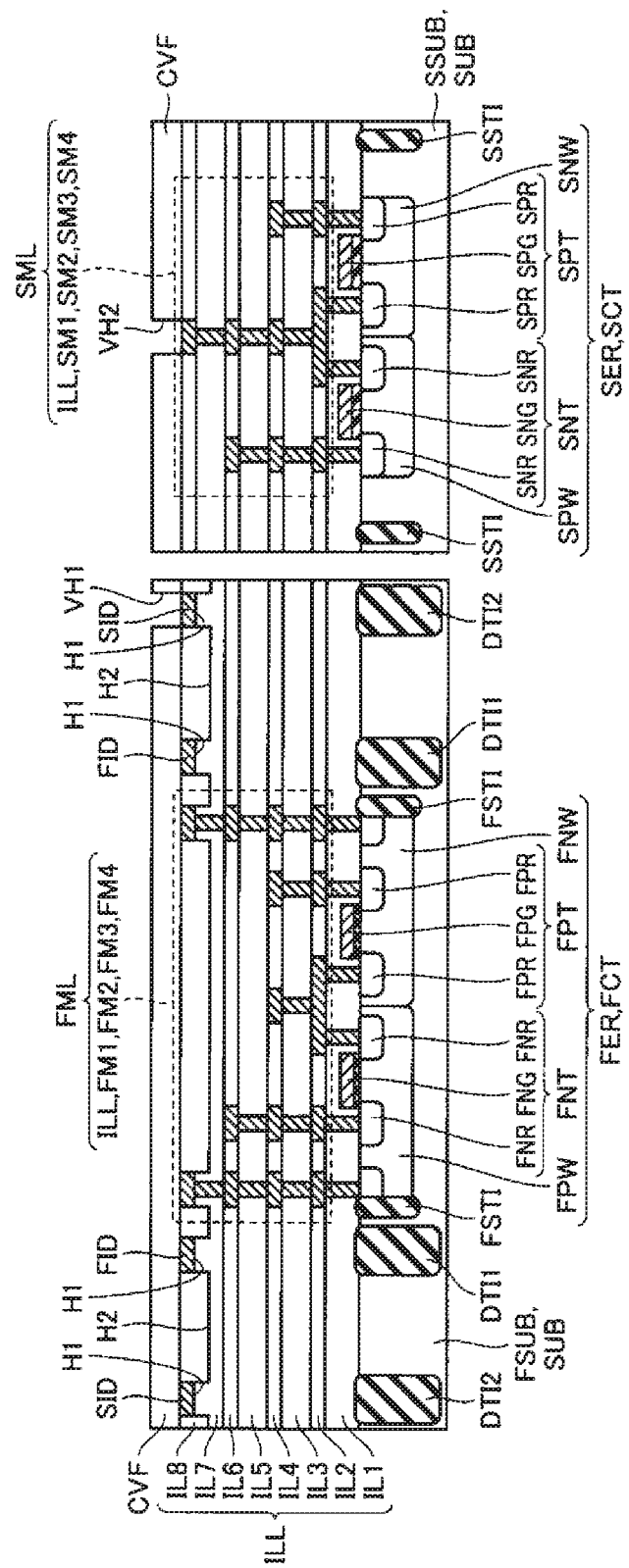
FIG. 38 is a cross-sectional view illustrating steps performed after the steps shown in FIG. 37 in the embodiment.

As a result, as shown in FIG. 38, an opening VH1 is formed in the cover film CVF of the first semiconductor substrate FSUB to expose the surface of the second inductor SID. In the cover film CVF of the second semiconductor substrate SSUB, an opening VH2 exposing the surface of the wiring SM4 is formed. Thereafter, the semiconductor device SDV shown in FIG. 33 are completed through the same steps as those shown in FIGS. 18 to 20.

In addition to the effects described in the first embodiment, the semiconductor device SDV described above have the following effects.

As shown in FIG. 33, the position of the surface H2 of the portion of the interlayer insulating film IL7 located between the first inductor FID and the second inductor SID is receded toward the semiconductor substrate SUB with respect to the position of the surface H1 of the portion of the interlayer insulating film IL7 where each of the first inductor FID and the second inductor SID is located.

This results in a longer creepage distance between the first inductor FID and the second inductor SID compared to when the position of the surface H2 is at the same position (height) as the position of the surface H 1. As a result, electrical insulation between the first inductor FID and the second inductor SID can be improved, and a signal can be transmitted by inductive coupling.

Fifth embodiment, examples of structures capable of securing a creeping distance between the second inductor SID and the end of the first semiconductor chip SCP1 in addition to the creeping distance between the first inductor FID and the second inductor SID will be described.

Figure 39:
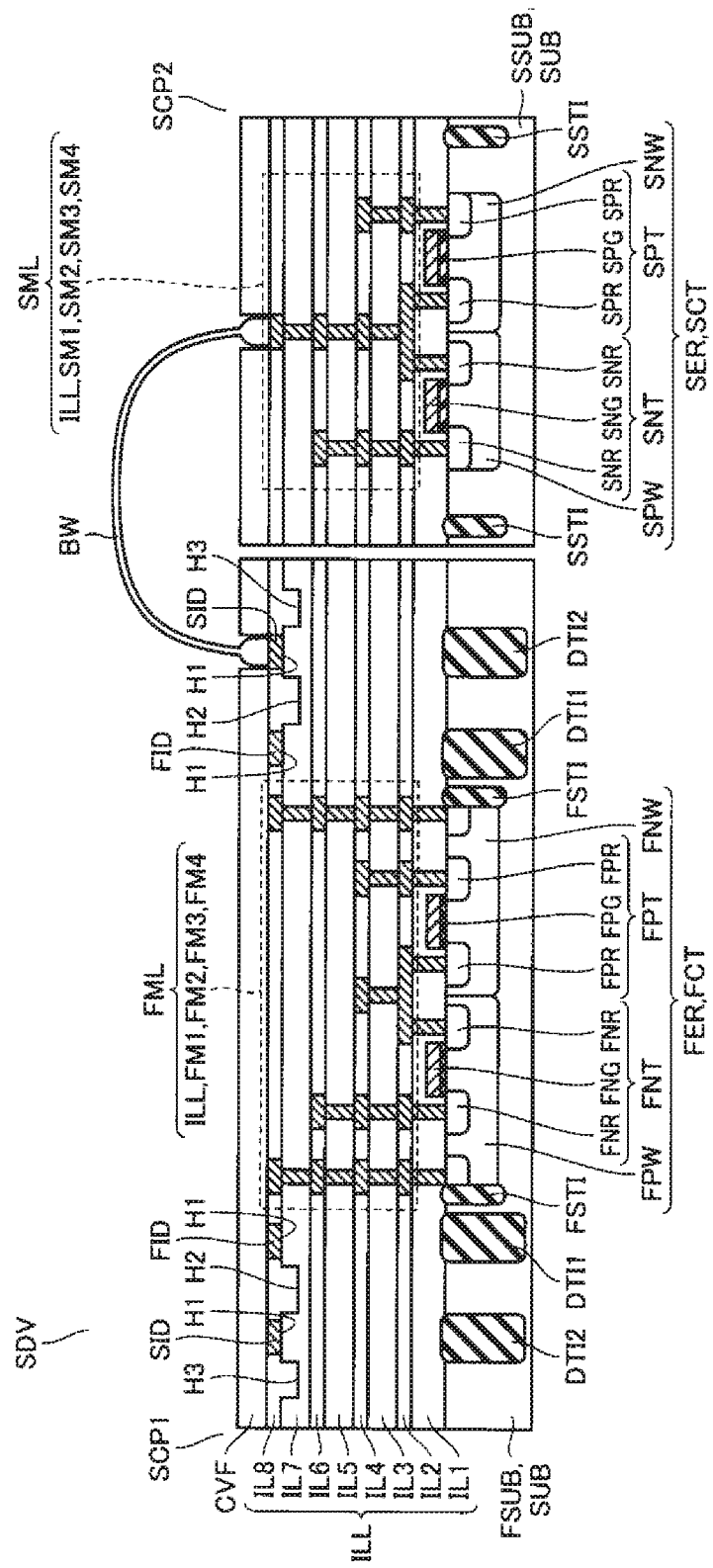
FIG. 39 is a cross-sectional view of a first semiconductor chip and a second semiconductor chip in a semiconductor device according to fifth embodiment.

As shown in FIG. 39, in the first semiconductor chip SCP1 of the semiconductor device SDV, the position of the surface H2 of the portion of the interlayer insulating film IL7 located between the first inductor FID and the second inductor SID recedes toward the semiconductor substrate SUB with respect to the position of the surface H1 of the portion of the interlayer insulating film IL7 where each of the first inductor FID and the second inductor SID is located.

Further, the position of the surface H3 of the part of the interlayer insulating film IL7 located between the second inductor SID and the end of the first semiconductor chip SCP1 recedes toward the semiconductor substrate SUB with respect to the position of the surface H1 of the part of the interlayer insulating film IL7 where the second inductor SID is located.

That is, the position of the interface (surface H2) between the portion of the interlayer insulating film IL7 located between the first inductor FID and the second inductor SID and the interlayer insulating film IL8 recedes toward the semiconductor substrate SUB with respect to the position of the interface (surface H1) between the first inductor FID or the second inductor SID and the portion of the interlayer insulating film IL7.

Further, the position of the interface (surface H3) between the portion of the interlayer insulating film IL7 located between the second inductor SID and the end of the first semiconductor chip SCP1 and the interlayer insulating film IL8 retreats toward the semiconductor substrate SUB with respect to the position of the interface (surface H1) between the second inductor SID and the portion of the interlayer insulating film IL7. Since other configurations are the same as those of the semiconductor device shown in FIG. 3, the same members are denoted by the same reference numerals, and descriptions thereof will not be repeated except when required.

Figure 40:
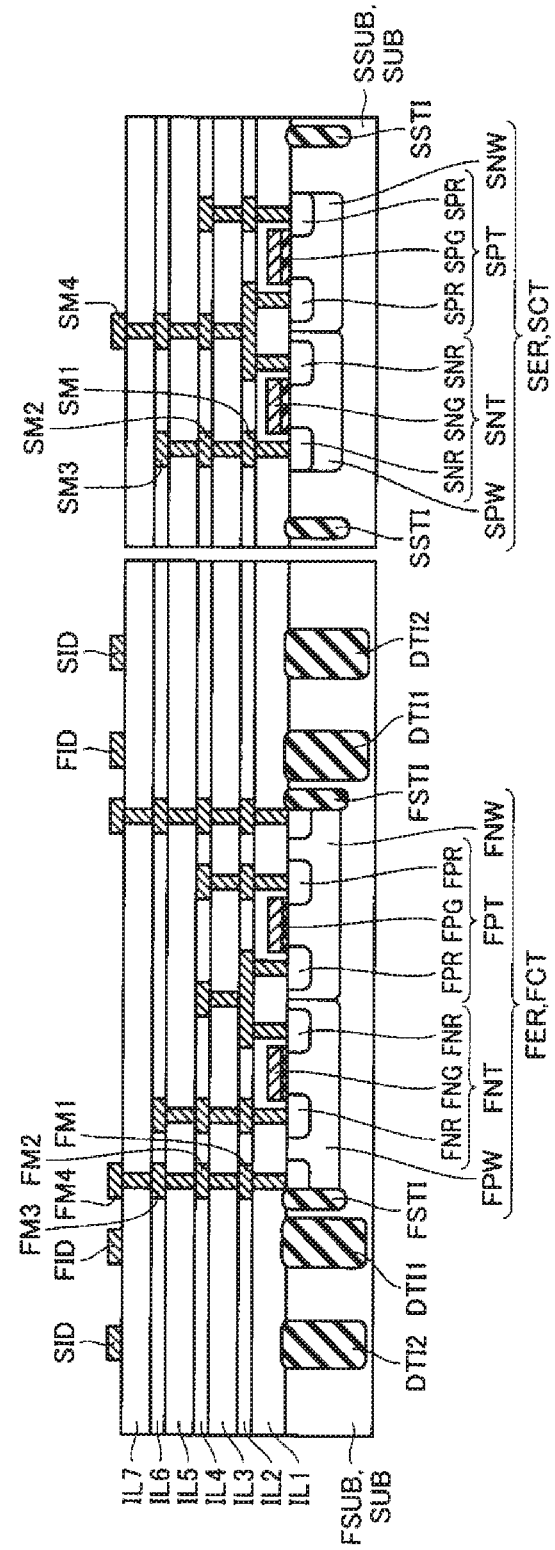
FIG. 40 is a cross-sectional view illustrating one step of the manufacturing method of semiconductor device in the embodiment.

Next, an example of the manufacturing method of the semiconductor device SDVs described above will be described. Through the same steps as those shown in FIGS. 4 to 14, as shown in FIG. 40, the wiring FM4, the first inductor FID, and the second inductor SID are formed so as to be in contact with surfaces of the interlayer insulating film IL7 of the first semiconductor substrate FSUB. The wiring SM4 is formed so as to be in contact with the surface of the interlayer insulating film IL7 of the second semiconductor substrate SSUB.

Figure 41:
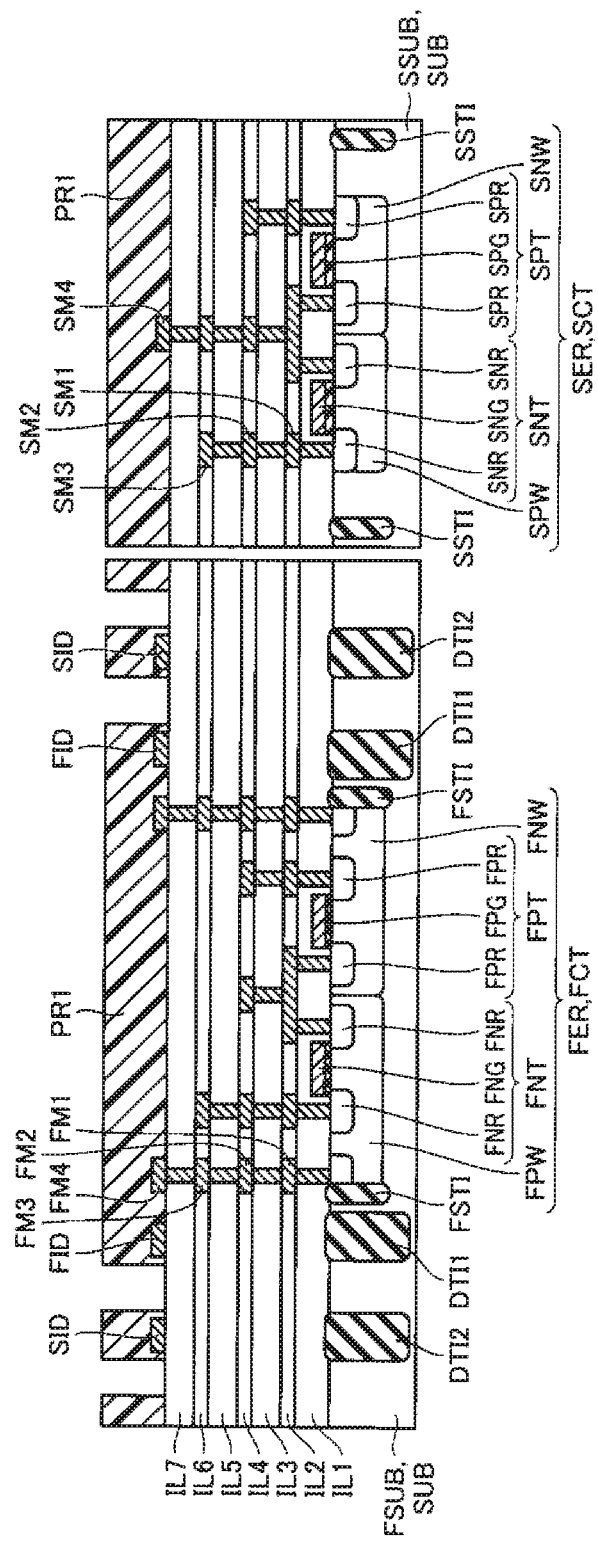
FIG. 41 is a cross-sectional view illustrating steps performed after the steps shown in FIG. 40 in the embodiment.
Figure 42:
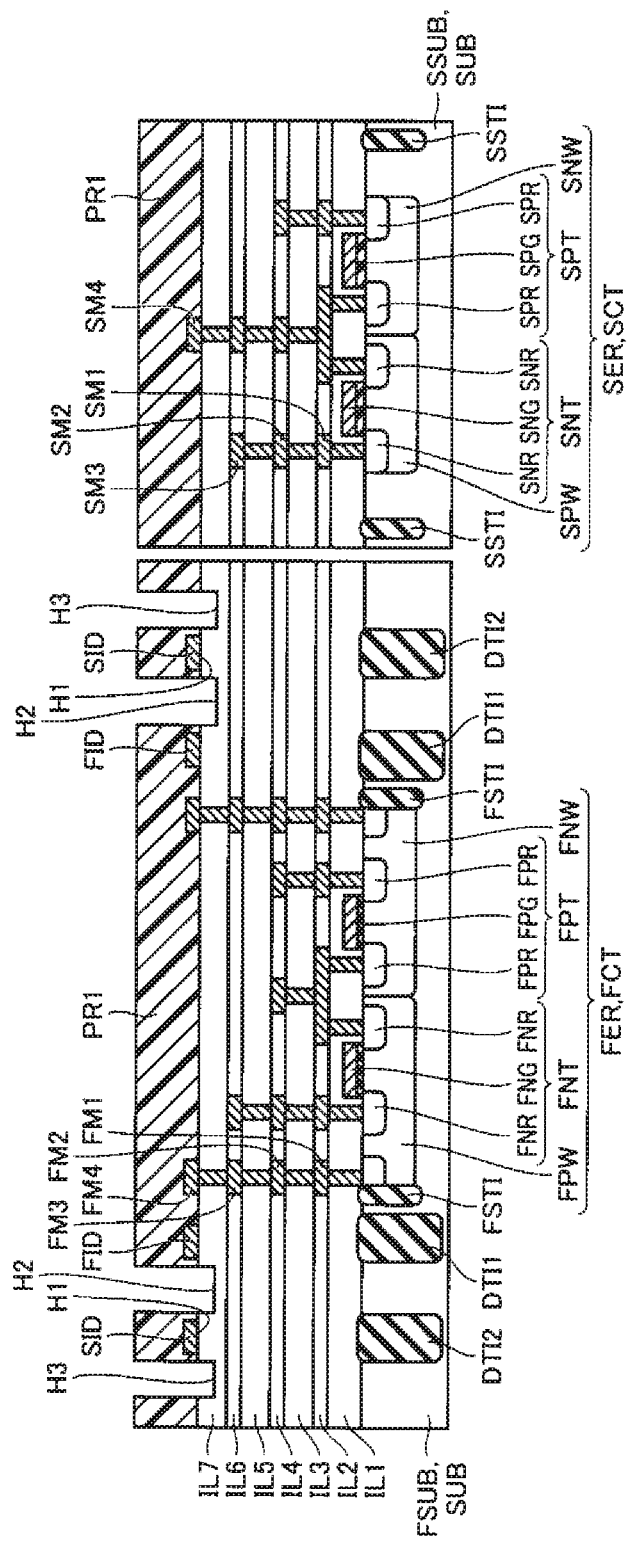
FIG. 42 is a cross-sectional view illustrating steps performed after the steps shown in FIG. 41 in the embodiment.
Figure 43:
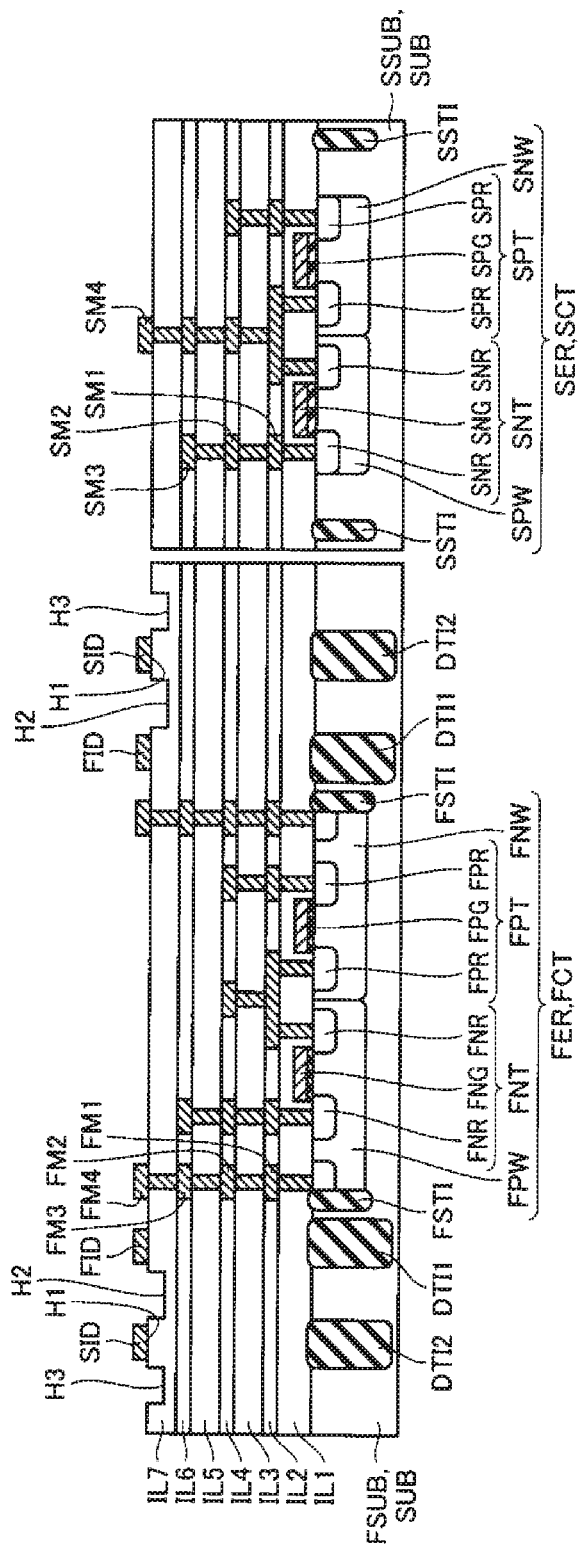
FIG. 43 is a cross-sectional view illustrating steps performed after the steps shown in FIG. 42 in the embodiment.

Next, as shown in FIG. 41, a photo resist pattern PR1 is formed by performing a predetermined photolithography treatment. Next, as shown in FIG. 42, an etching treatment is performed on the interlayer insulating film IL7 using the photoresist pattern PR1 as an etching mask. Next, as shown in FIG. 43, the photoresist pattern PR1 is removed.

In this manner, the position of the surface H2 of the portion of the interlayer insulating film IL7 located between the first inductor FID and the second inductor SID retreats toward the semiconductor substrate SUB with respect to the position of the surface H1 of the portion of the interlayer insulating film IL7 where each of the first inductor FID and the second inductor SID is located. The position of the surface H3 of the part of the interlayer insulating film IL7 located between the second inductor SID and the end of the first semiconductor chip SCP1 recedes toward the semiconductor substrate SUB with respect to the position of the surface H1 of the part of the interlayer insulating film IL7 where the second inductor SID is located.

Figure 44:
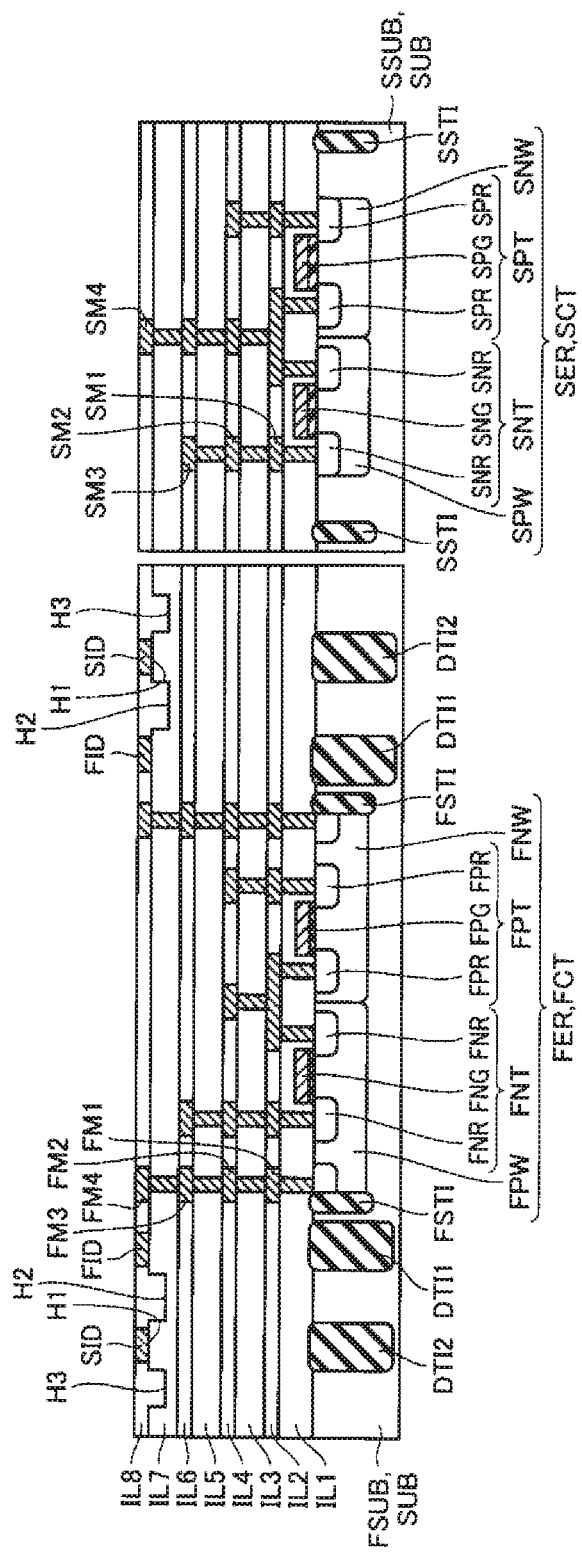
FIG. 44 is a cross-sectional view illustrating a step performed after the step shown in FIG. 43 in the embodiment.
Figure 45:
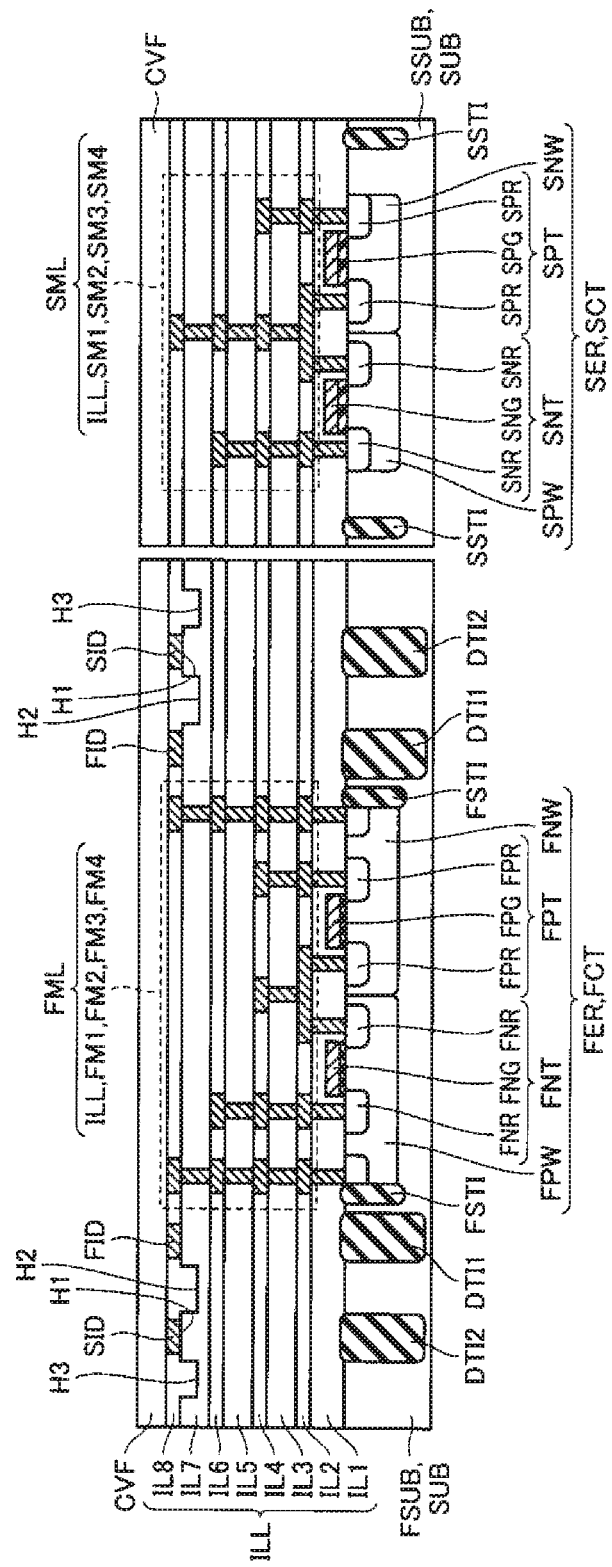
FIG. 45 is a cross-sectional view illustrating a step performed after the step shown in FIG. 44 in the embodiment.

Next, as shown in FIG. 44, an interlayer insulating film IL8 is formed so as to fill a space between the first inductor FID and the second inductor SID. Next, through a process similar to the process shown in FIG. 16, as shown in FIG. 45, a cover film CVF is formed on the interlayer insulating film IL8 so as to cover the wiring FM4, the first inductor FID, and the second inductor SID. A cover film CVF is formed on the interlayer insulating film IL8 so as to cover the wiring SM4. Next, predetermined photolithography treatment and etching treatment are performed, respectively.

Figure 46:
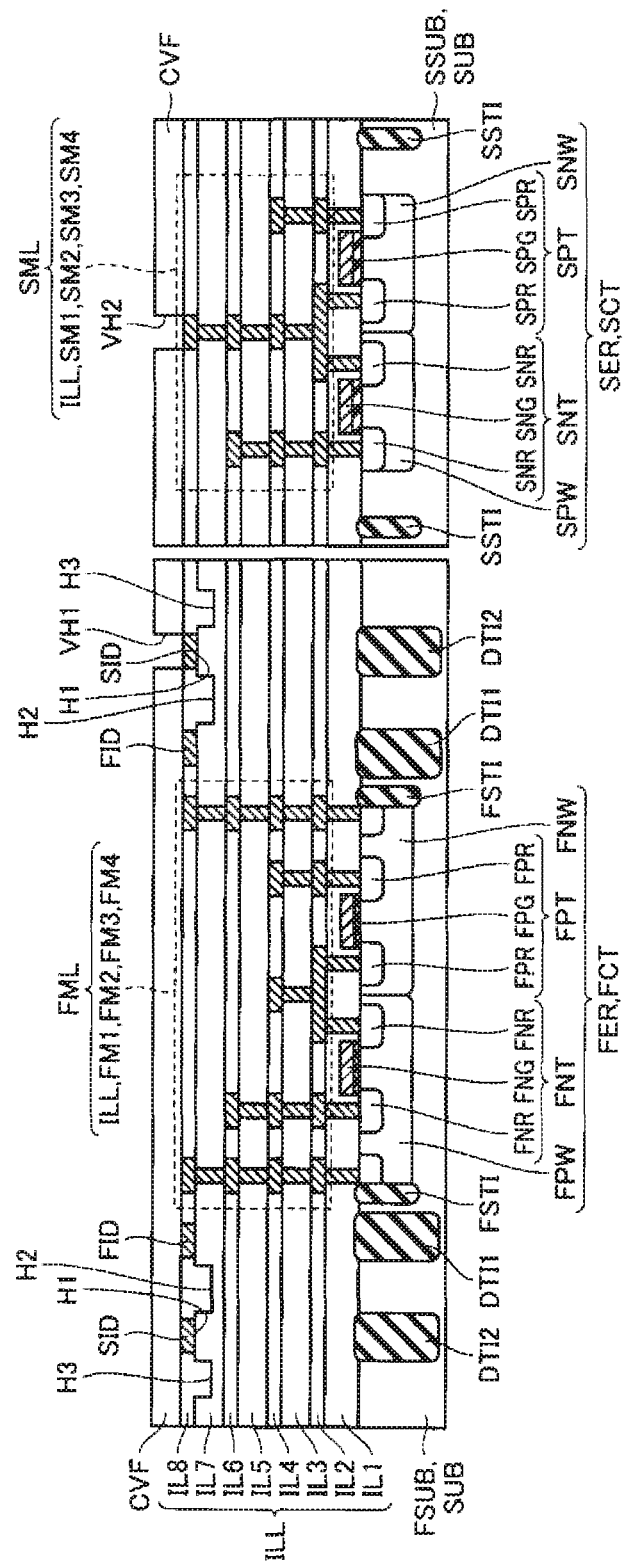
FIG. 46 is a cross-sectional view illustrating steps performed after the steps shown in FIG. 45 in the embodiment.

As a result, as shown in FIG. 46, an opening VH1 is formed in the cover film CVF of the first semiconductor substrate FSUB to expose the surface of the second inductor SID. In the cover film CVF of the second semiconductor substrate SSUB, an opening VH2 exposing the surface of the wiring SM4 is formed. Thereafter, the semiconductor device SDVs shown in FIG. 39 are completed through the same steps as those shown in FIGS. 18 to 20.

In addition to the effects described in the first embodiment, the semiconductor device SDV described above have the following effects.

As shown in FIG. 39, first, the position of the surface H2 of the portion of the interlayer insulating film IL7 located between the first inductor FID and the second inductor SID is receded toward the semiconductor substrate SUB with respect to the position of the surface H1 of the portion of the interlayer insulating film IL7 where each of the first inductor FID and the second inductor SID is located.

This results in longer creepage distances between the first inductor FID and the second inductor SID compared to when the position of the surface H2 is at the same position (height) as the position of the surface H 1, similar to the semiconductor device SDVs associated with fourth embodiment. As a result, electrical insulation between the first inductor FID and the second inductor SID can be improved, and a signal can be transmitted by inductive coupling.

Further, the position of the surface H3 of the part of the interlayer insulating film IL7 located between the second inductor SID and the end of the first semiconductor chip SCP1 is set back toward the semiconductor substrate SUB with respect to the position of the surface H1 of the part of the interlayer insulating film IL7 where the second inductor SID is located.

Here, it has been found that in semiconductor device SDV, when dielectric breakdown occurs, breakdown often occurs through the interface between the end of the first semiconductor chip SCP1 and the sealing resin REN. Therefore, by retreating the position of the surface H3 toward the semiconductor substrate SUB with respect to the position of the surface H1, the creeping distances between the second inductor SID and the end of the first semiconductor chip SCP1 are longer than when the position of the surface H3 is at the same position (height) as the position of the surface H1. As a result, dielectric breakdown through the interface between the end of the first semiconductor chip SCP1 and the sealing resin REN can be suppressed.

In addition, by performing an etching process on the interlayer insulating film IL7 using the photoresist pattern PR1 as an etching mask, it is possible to select an area of the surface H3 that is receded toward the semiconductor substrate SUB with respect to the position of the surface H1.

In the sixth embodiment, another example of a structure that can secure a creepage distance between the second inductor SID and the end of the first semiconductor chip SCP1 in addition to the creepage distance between the first inductor FID and the second inductor SID will be described.

Figure 47:
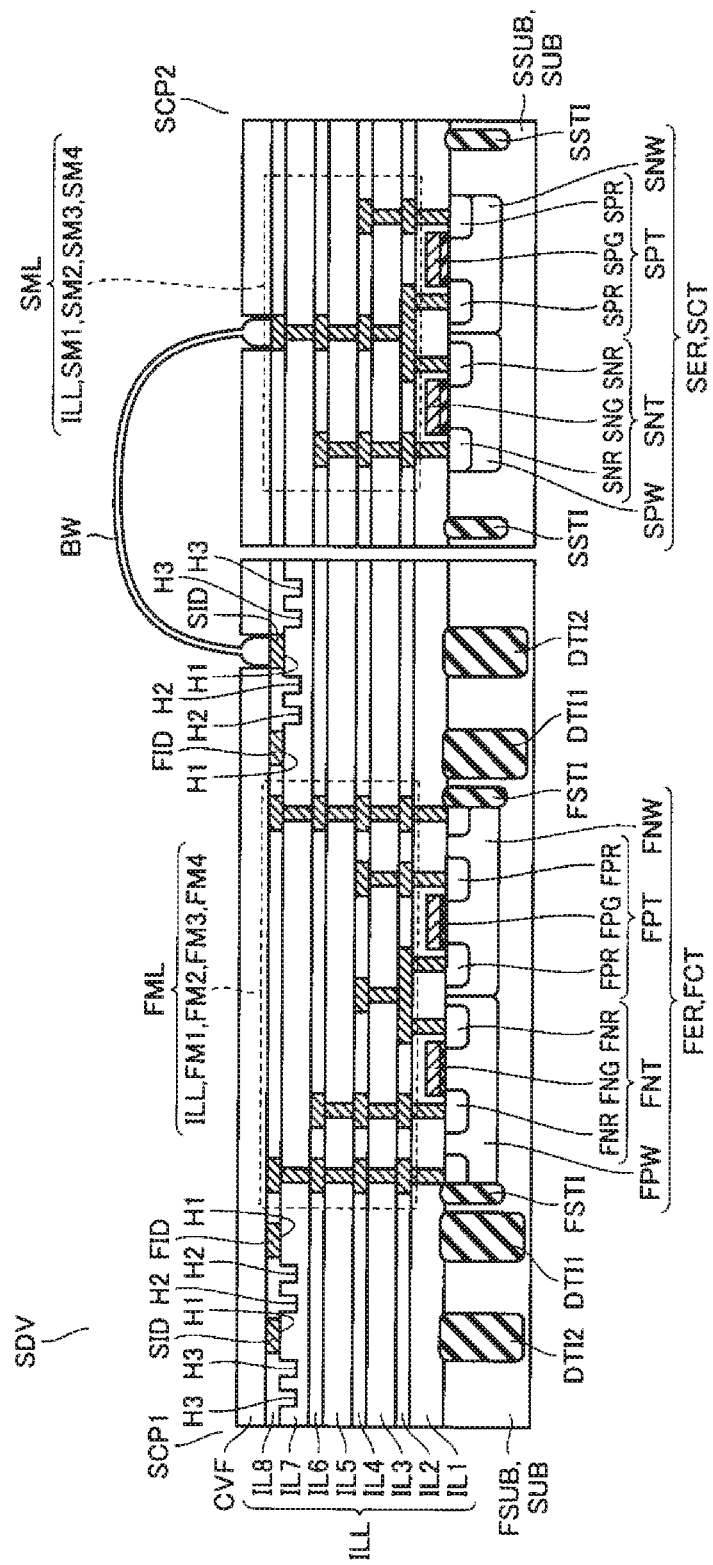
FIG. 47 is a cross-sectional view of the first and second semiconductor chips in the semiconductor device according to sixth embodiment.

As shown in FIG. 47, in the first semiconductor chip SCP1 of the semiconductor device SDV, the position of the surface H2 retreats toward the semiconductor substrate SUB in at least two places in the portion of the interlayer insulating film IL7 located between the first inductor FID and the second inductor SID with respect to the position of the surface H1 of the portion of the interlayer insulating film IL7 in which each of the first inductor FID and the second inductor SID is located.

Further, the position of the surface H3 retreats toward the semiconductor substrate SUB in at least two places in the portion of the interlayer insulating film IL7 located between the second inductor SID and the end of the first semiconductor chip SCP1 with respect to the position of the surface H1 of the portion of the interlayer insulating film IL7 where the second inductor SID is located.

That is, the position of the interface (surface H2) between the portion of the interlayer insulating film IL7 located between the first inductor FID and the second inductor SID and the interlayer insulating film IL8 recedes toward the semiconductor substrate SUB with respect to the position of the interface (surface H1) between the first inductor FID or the second inductor SID and the portion of the interlayer insulating film IL7 in at least two places.

The position of the interface (surface H3) between the portion of the interlayer insulating film IL7 located between the second inductor SID and the end of the first semiconductor chip SCP1 and the interlayer insulating film IL8 retreats toward the semiconductor substrate SUB with respect to the position of the interface (surface H1) between the second inductor SID and the portion of the interlayer insulating film IL7 in at least two places. Since other configurations are the same as those of the semiconductor device shown in FIG. 3, the same members are denoted by the same reference numerals, and descriptions thereof will not be repeated except when required.

Figure 48:
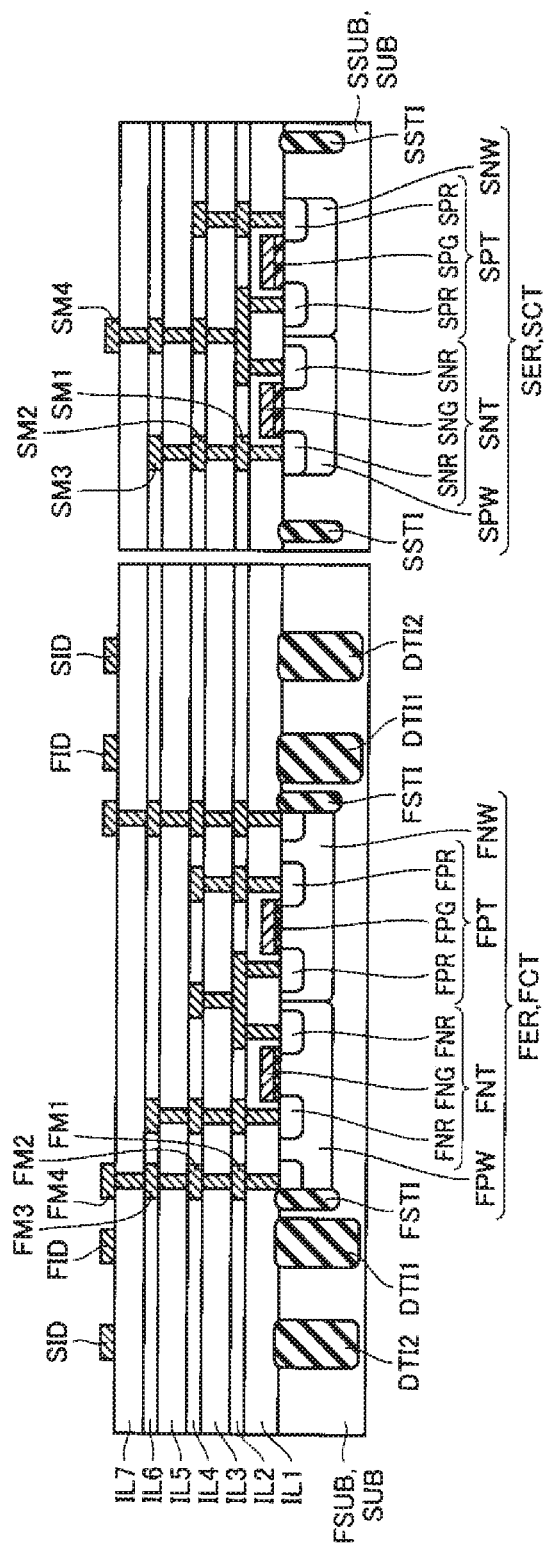
FIG. 48 is a cross-sectional view illustrating one step of the manufacturing method of semiconductor device in the embodiment.

Next, an example of the manufacturing method of the semiconductor device SDV described above will be described. Through the same steps as those shown in FIGS. 4 to 14, as shown in FIG. 48, the wiring FM4, the first inductor FID, and the second inductor SID are formed so as to be in contact with surfaces of the interlayer insulating film IL7 of the first semiconductor substrate FSUB. The wiring SM4 is formed so as to be in contact with the surface of the interlayer insulating film IL7 of the second semiconductor substrate SSUB.

Figure 49:
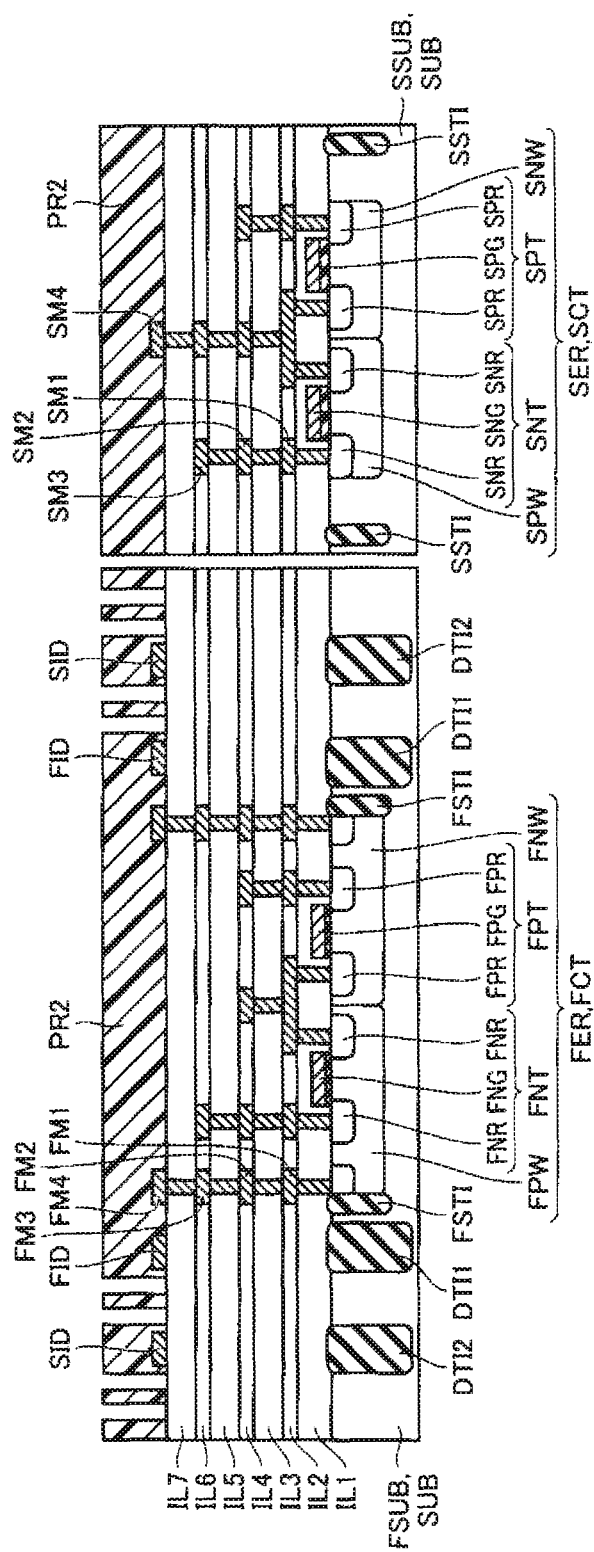
FIG. 49 is a cross-sectional view illustrating steps performed after the steps shown in FIG. 48 in the embodiment.
Figure 50:
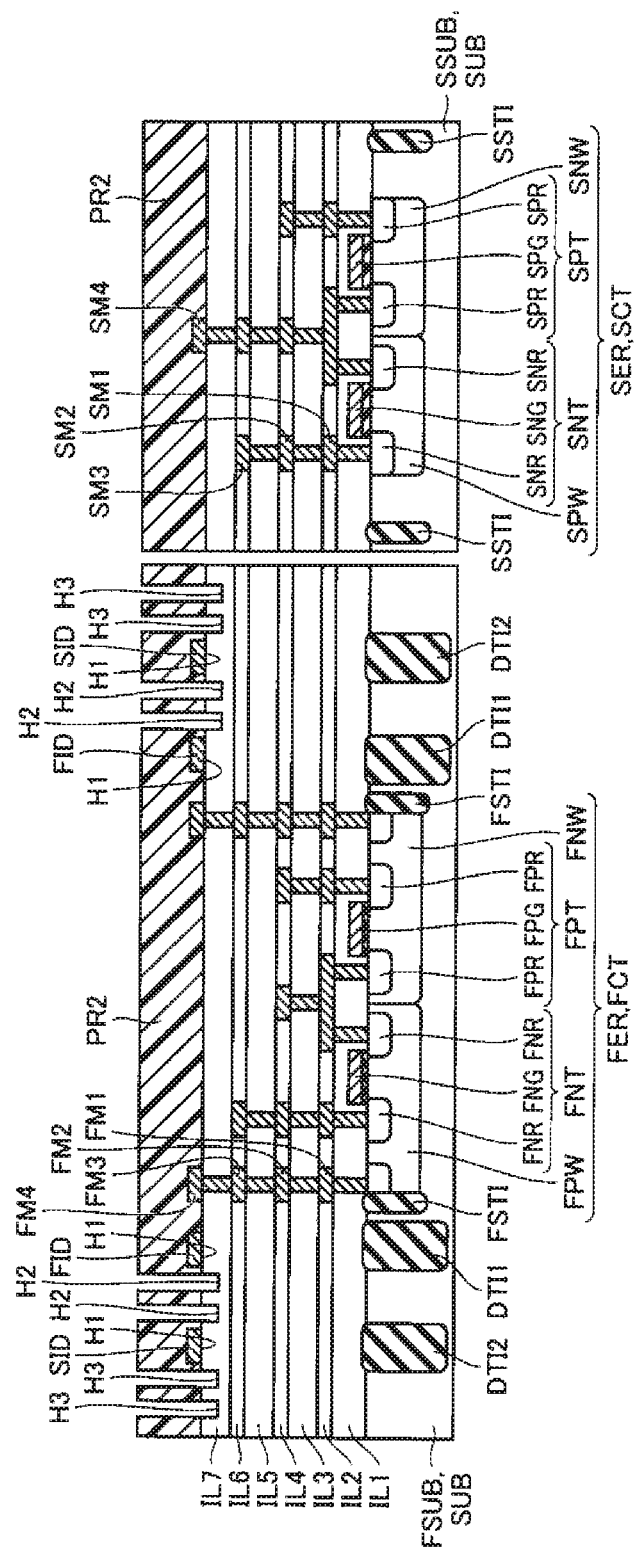
FIG. 50 is a cross-sectional view illustrating steps performed after the steps shown in FIG. 49 in the embodiment.
Figure 51:
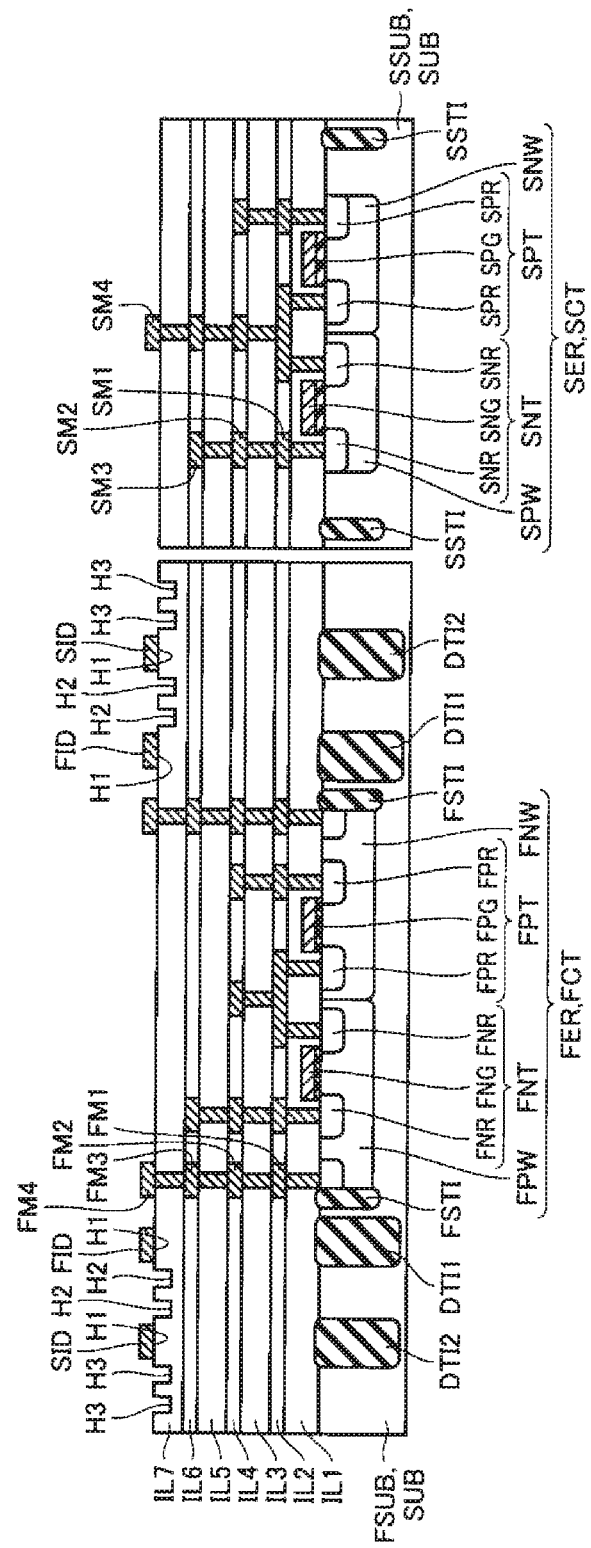
FIG. 51 is a cross-sectional view illustrating steps performed after the steps shown in FIG. 50 in the embodiment.

Next, as shown in FIG. 49, a photo resist pattern PR2 is formed by performing a predetermined photolithography treatment. Next, as shown in FIG. 50, an etching treatment is performed on the interlayer insulating film IL7 using the photoresist pattern PR2 as an etching mask. Next, as shown in FIG. 51, the photoresist pattern PR1 is removed.

Thus, the position of the surface H2 retreats toward the semiconductor substrate SUB in at least two places in the portion of the interlayer insulating film IL7 located between the first inductor FID and the second inductor SID with respect to the position of the surface H1 of the portion of the interlayer insulating film IL7 where each of the first inductor FID and the second inductor SID is located.

Further, the position of the surface H3 retreats toward the semiconductor substrate SUB in at least two places in the portion of the interlayer insulating film IL7 located between the second inductor SID and the end of the first semiconductor chip SCP1 with respect to the position of the surface H1 of the portion of the interlayer insulating film IL7 where the second inductor SID is located.

Figure 52:
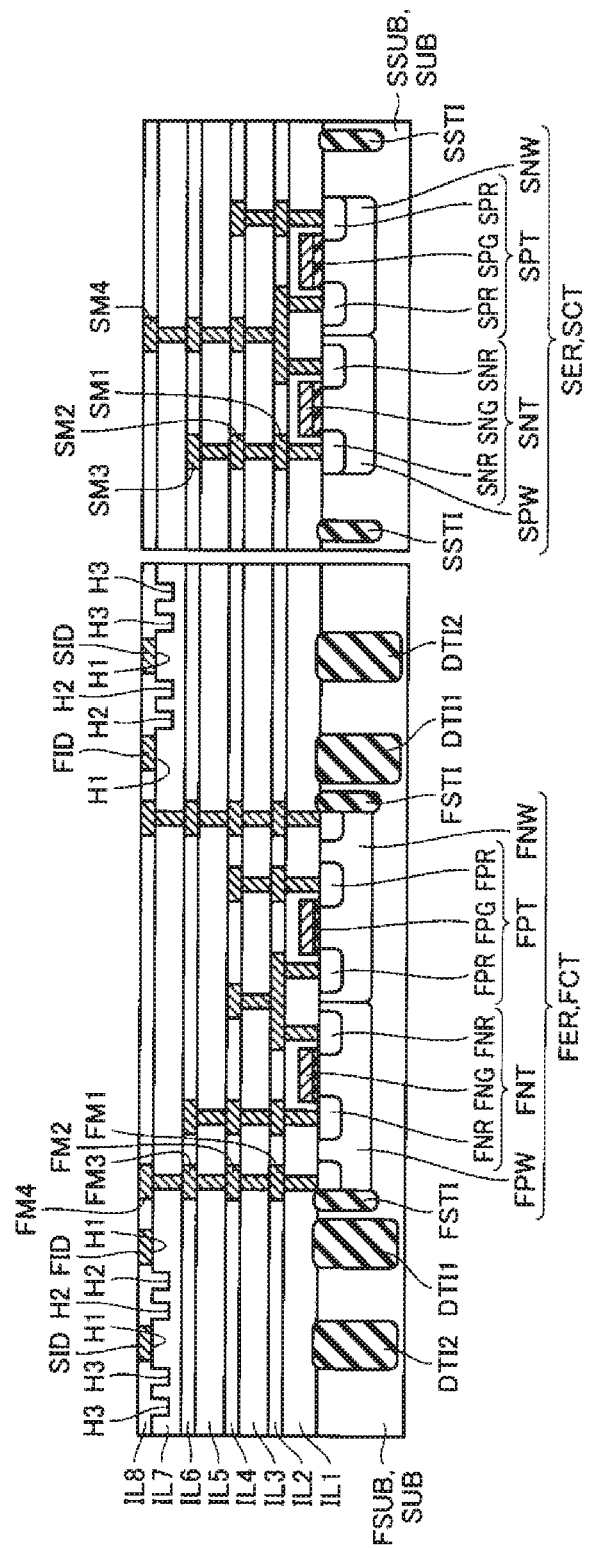
FIG. 52 is a cross-sectional view illustrating steps performed after the steps shown in FIG. 51 in the embodiment.
Figure 53:
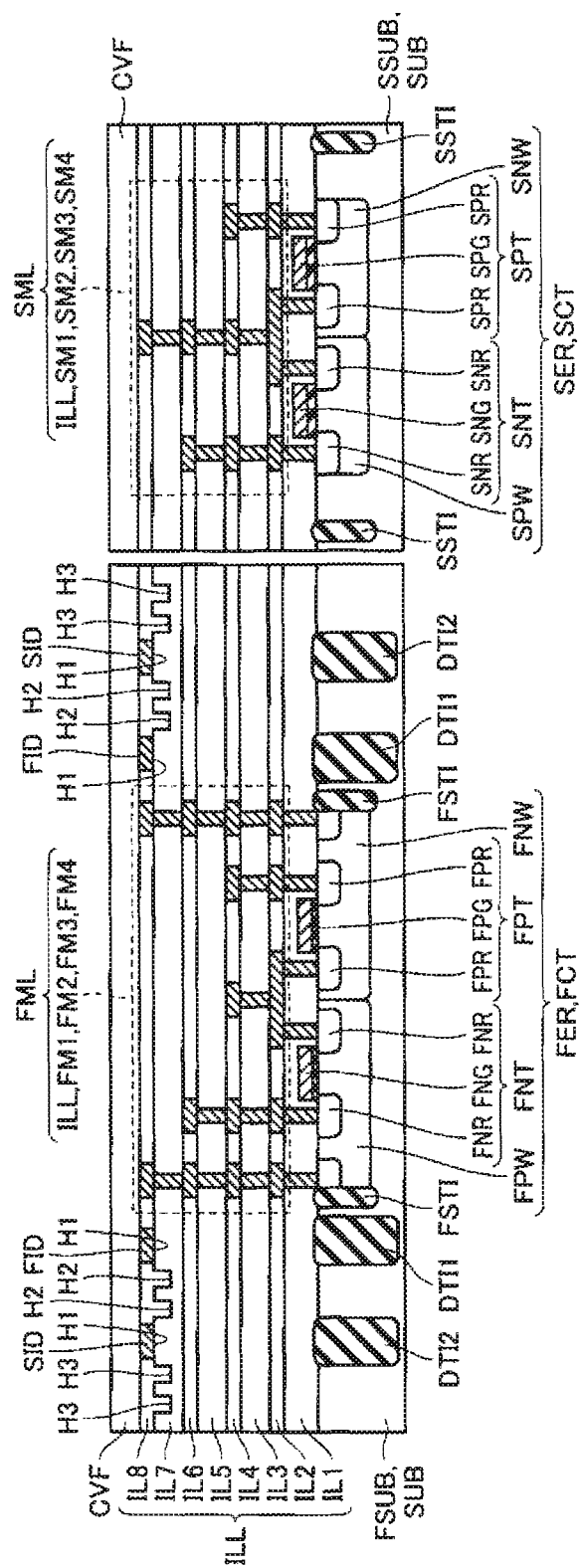
FIG. 53 is a cross-sectional view illustrating steps performed after the steps shown in FIG. 52 in the embodiment.

Next, as shown in FIG. 52, an interlayer insulating film IL8 is formed so as to fill a space between the first inductor FID and the second inductor SID. Next, through a process similar to the step shown in FIG. 16, as shown in FIG. 53, a cover film CVF is formed on the interlayer insulating film IL8 so as to cover the wiring FM4, the first inductor FID, and the second inductor SID. A cover film CVF is formed on the interlayer insulating film IL8 so as to cover the wiring SM4. Next, predetermined photolithography treatment and etching treatment are performed, respectively.

Figure 54:
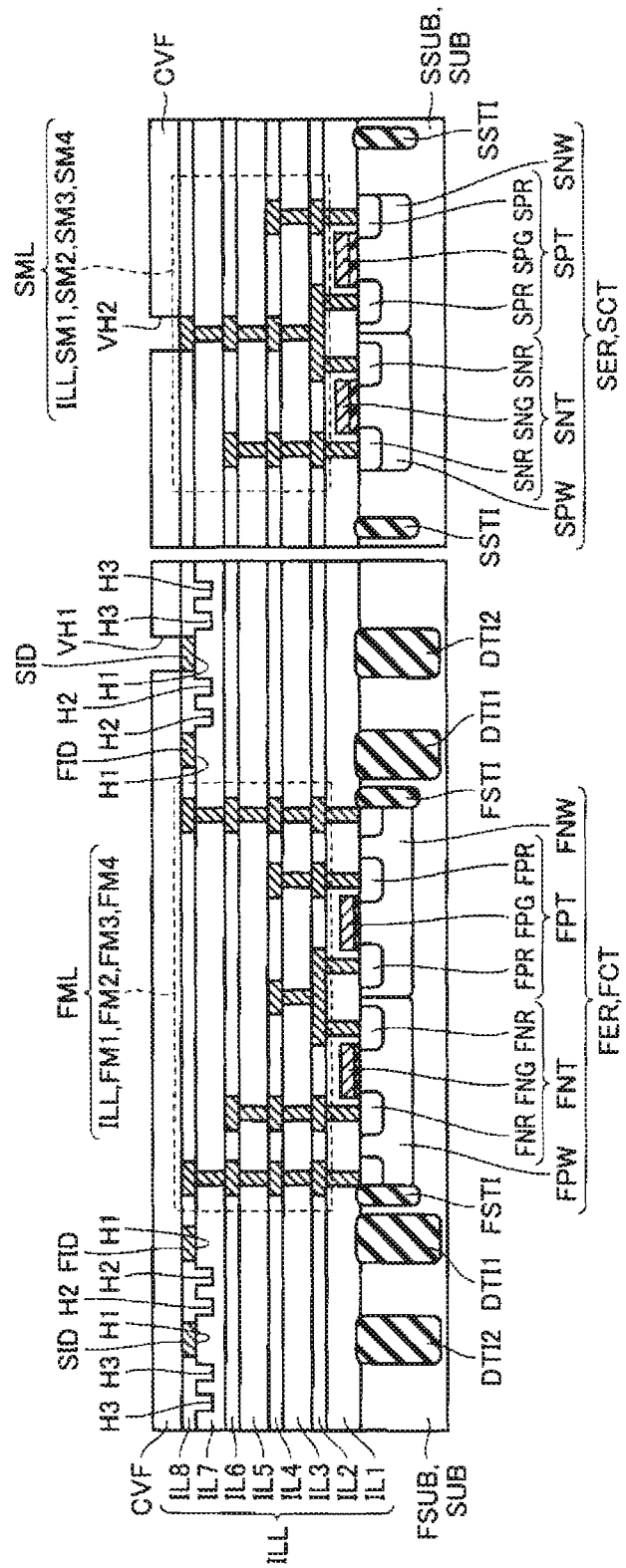
FIG. 54 is a cross-sectional view illustrating a step performed after the step shown in FIG. 53 in the embodiment.

As a result, as shown in FIG. 54, an opening VH1 is formed in the cover film CVF of the first semiconductor substrate FSUB to expose the surface of the second inductor SID. In the cover film CVF of the second semiconductor substrate SSUB, an opening VH2 exposing the surface of the wiring SM4 is formed. Thereafter, the semiconductor device SDV shown in FIG. 47 is completed through the same steps as those shown in FIGS. 18 to 20.

In addition to the effects described in the first embodiment, the semiconductor device SDV described above has the following effects.

As shown in FIG. 47, first, the position of the surface H2 retreats toward the semiconductor substrate SUB in at least two places in the portion of the interlayer insulating film IL7 located between the first inductor FID and the second inductor SID with respect to the position of the surface H1 of the portion of the interlayer insulating film IL7 where each of the first inductor FID and the second inductor SID is located.

Thereby, the creepage distance between the first inductor FID and the second inductor SID is longer than the corresponding creepage distance in the semiconductor device SDV described in fifth embodiment. As a result, electrical insulation between the first inductor FID and the second inductor SID can be further improved, and a signal can be transmitted by inductive coupling.

Further, the position of the surface H3 retreats toward the semiconductor substrate SUB in at least two places in the portion of the interlayer insulating film IL7 located between the second inductor SID and the end of the first semiconductor chip SCP1 with respect to the position of the surface H1 of the portion of the interlayer insulating film IL7 where the second inductor SID is located.

As a result, the creeping distance between the second inductor SID and the end of the first semiconductor chip SCP1 is longer than the corresponding creeping distance in the semiconductor device SDV described in fifth embodiment. As a result, dielectric breakdown through the interface between the end of the first semiconductor chip SCP1 and the sealing resin REN can be reliably suppressed.

Modification

The modification of the semiconductor device according to the respective embodiments will be described. In the semiconductor device SDV according to the above-described embodiments, the first insulator DTI1 and the second insulator DTI2 have the same width W1. The width of the first insulator DTI1 and the width of the second insulator DTI2 do not necessarily have to be the same width, and may be different.

Figure 55:
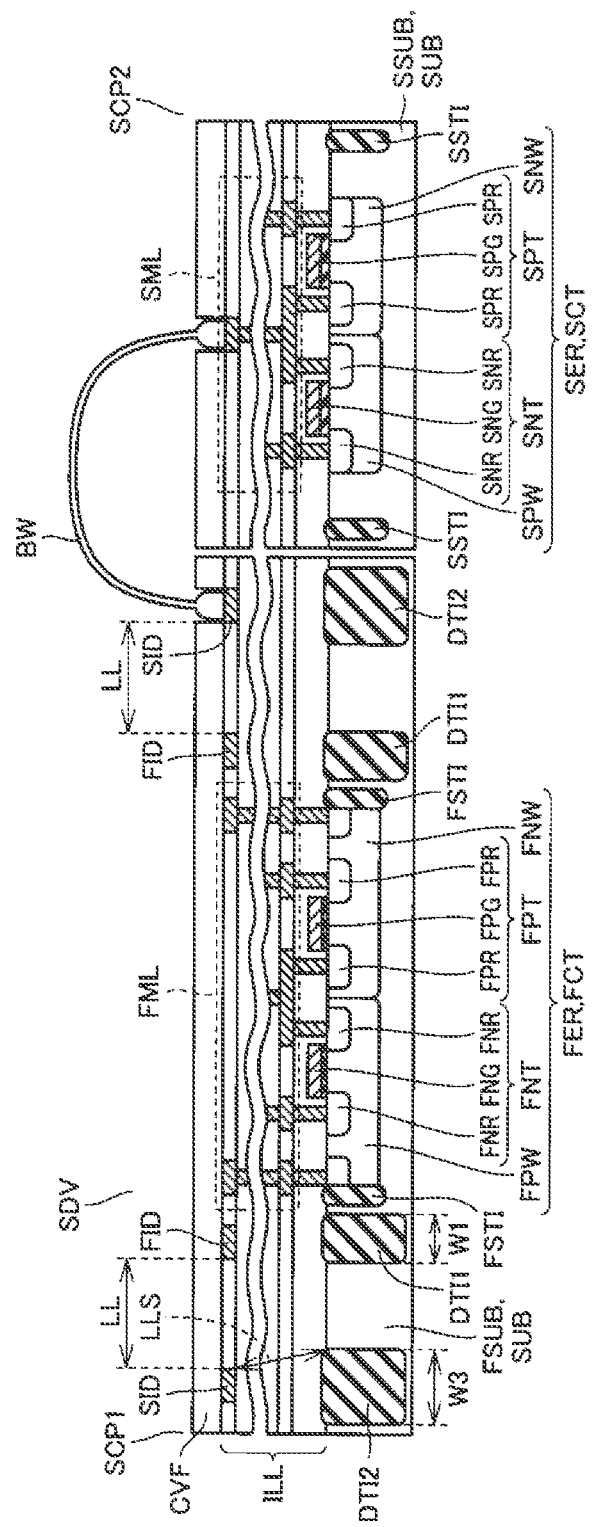
FIG. 55 is a cross-sectional view of the first semiconductor chip and the second semiconductor chip in a semiconductor device according to modification of each embodiment.

As shown in FIG. 55, for example, when the number of wiring layers of the multilayer wiring structure FML is relatively small and the thickness of the multilayer wiring structure FML is small, the distance LLS between the second inductor SID and the second insulator DTI2 may be shorter than the distance LL between the first inductor FID and the second inductor SID. In such cases, it is preferable that the width of the second insulator DTI2 has a width W3 larger than the width W1 of the first insulator DTI1 from the viewpoint of increasing the dielectric strength of the semiconductor device SDV.

By setting the width of the second insulator DTI2 to the width W3 greater than the width W1, the distance LLS between the second inductor SID and the second insulator DTI2 can be made longer than when the width of the second insulator DTI2 is the width W1. As a result, the dielectric strength of the semiconductor device SDVs can be improved. In order to ensure the distance LLS, the second insulator DTI2 preferably has a width W3 that is wider than the width W1 in a manner that extends in a plane view from a portion located directly beneath the second inductor SID to a direction that intersects the direction in which the second inductor SID extends.

In the semiconductor device SDV described in the respective embodiments, two-chip types of the first semiconductor chip SCP1 and the second semiconductor chip SCP2 are exemplified. The semiconductor device SDV may be a one-chip type in which the first circuit FCT, the second circuit SCT, the first inductor FID, and the second inductor SID are formed in one semiconductor substrate SUB.

The semiconductor device described in the respective embodiments can be combined in various manners as required.

Although the invention made by the present inventor has been specifically described based on the embodiment, the present invention is not limited to the embodiment described above, and it is needless to say that various modifications can be made without departing from the gist thereof.

What is claimed is:

1. A semiconductor device comprising:
   a semiconductor substrate;
   a multi-layer wiring structure formed to cover the semiconductor substrate, the multi-layer wiring structure including:
      a plurality of wirings; and
      a plurality of interlayer insulating films electrically isolating the plurality of wiring, respectively;
   a first circuit driven by a first voltage;
   a second circuit driven by a second voltage greater than the first voltage;
   a first inductor electrically connected with the first circuit, the first inductor being formed in a first interlayer insulating film of the plurality of interlayer insulating films; and
   a second inductor electrically connected with the second circuit, the second inductor being formed in a second interlayer insulating film of the plurality of interlayer insulating films, the second interlayer insulating film being different from the first interlayer insulating film,
   wherein, in plan view, the first inductor and the second inductor are disposed such that the first inductor and the second inductor do not overlap each other and are arranged along each other.

2. The semiconductor device according to claim 1, wherein the semiconductor substrate is located below the first inductor and the second inductor, and
   wherein the semiconductor device comprising:
      a first insulator formed in the semiconductor substrate, wherein the first inductor overlapping the first insulator in plan view; and
      a second insulator formed in the semiconductor substrate, wherein the second inductor overlapping the second insulator in plan view.

3. The semiconductor device according to claim 2, comprising an element isolation insulating film formed in the semiconductor substrate, the element isolation insulating film defining a first element region in which the first circuit is formed,
   wherein the first insulator and the second insulator are formed from a surface of the semiconductor substrate to a position deeper than a bottom of the element isolation insulating film.

4. The semiconductor device according to claim 1,
   wherein the semiconductor substrate is disposed below the first inductor and the second inductor, and
   wherein at least one of the first inductor and the second inductor directly contacts a surface of one of the interlayer insulating film among the plurality of interlayer insulating films.

5. The semiconductor device according to claim 4, wherein both the first inductor and the second inductor are formed such that the first inductor and the second inductor contact the surface of the one of the interlayer insulating film.

6. The semiconductor device according to claim 5,
   wherein, in plan view, the surface of the one of the interlayer insulating films includes a first portion disposed between the first inductor and the second inductor,
   wherein, in plan view, the surface of the one of the interlayer insulating film includes a second portion where each of the first inductor and the second inductor is disposed, and
   wherein a surface of the second portion is disposed closer to a surface of the semiconductor substrate than a surface of the first portion.

7. The semiconductor device according to claim 4, wherein a surface of a third portion located in a region outer side than the second inductor in the interlayer insulating film is disposed closed to a surface of the semiconductor substrate than a surface of a fourth portion where each of the second inductor in the one of the interlayer insulating film.

8. The semiconductor device according to claim 4, wherein, in the multi-layer wiring structure, the second inductor is formed so as to be in contact with a surface of the one of the interlayer insulating film, and the first inductor is formed so as to be in contact with a surface of another interlayer insulating film located on the semiconductor substrate side of the one of the interlayer insulating film among the plurality of interlayer insulating films.

9. The semiconductor device according to claim 4, wherein the first inductor and the second inductor have annular shape in plan view.

10. The semiconductor device according to claim 1, wherein a semiconductor substrate is disposed below the first inductor and the second inductor, and wherein the first inductor and the second inductor extend along an outer periphery of the semiconductor substrate in plan view.

* * * * *